US012396107B2

(12) United States Patent
Yoon et al.

(10) Patent No.: US 12,396,107 B2
(45) Date of Patent: Aug. 19, 2025

(54) DISPLAY DEVICE

(71) Applicant: Samsung Display Co., LTD., Yongin-si (KR)

(72) Inventors: Hyoyul Yoon, Yongin-si (KR); Kyoungah Lee, Yongin-si (KR); Eunhye Kang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 195 days.

(21) Appl. No.: 18/131,586

(22) Filed: Apr. 6, 2023

(65) Prior Publication Data
US 2024/0008197 A1 Jan. 4, 2024

(30) Foreign Application Priority Data

Jun. 29, 2022 (KR) .................. 10-2022-0080034

(51) Int. Cl.
*H05K 5/02* (2006.01)
(52) U.S. Cl.
CPC .................. *H05K 5/0217* (2013.01)
(58) Field of Classification Search
CPC ... H05K 5/0217; G06F 1/1637; G06F 1/1641; G06F 1/1681; G06F 1/1652
See application file for complete search history.

(56) References Cited

U.S. PATENT DOCUMENTS

| 11,076,495 | B2 | 7/2021 | Cromer et al. | |
|---|---|---|---|---|
| 11,487,327 | B2 * | 11/2022 | Horiuchi | G06F 1/1641 |
| 11,963,318 | B2 * | 4/2024 | Fu | H05K 5/0217 |
| 2019/0132987 | A1 | 5/2019 | Koo et al. | |
| 2020/0366770 | A1 * | 11/2020 | Kim | H04M 1/0268 |
| 2020/0389986 | A1 * | 12/2020 | Tsuchihashi | G06F 3/041 |
| 2021/0165454 | A1 * | 6/2021 | Dong | G06F 1/1652 |
| 2021/0325929 | A1 * | 10/2021 | Cai | B32B 3/04 |
| 2022/0093012 | A1 | 3/2022 | Lee et al. | |
| 2022/0132679 | A1 * | 4/2022 | Han | E05D 1/00 |
| 2022/0199922 | A1 * | 6/2022 | Choi | B32B 27/308 |
| 2022/0201879 | A1 * | 6/2022 | Kwak | G06F 1/1641 |
| 2022/0294886 | A1 * | 9/2022 | Seo | G09G 3/035 |

(Continued)

FOREIGN PATENT DOCUMENTS

| CN | 113257123 A | 8/2021 |
|---|---|---|
| KR | 1020190020303 A | 2/2019 |

OTHER PUBLICATIONS

Machine Translation of CN 113257123 (Year: 2024).*
Extended European Search Report for Application No. 23181961.6-1224 dated Nov. 21, 2023.

*Primary Examiner* — Sagar Shrestha
(74) *Attorney, Agent, or Firm* — CANTOR COLBURN LLP

(57) ABSTRACT

A display device includes: a display module; and a support plate disposed below the display module and including a first support plate, a second support plate, and a first folding plate disposed between the first support plate and the second support plate, where the first folding plate includes: a curved portion; a first reverse curvature portion disposed between the first support plate and the curved portion; and a second reverse curvature portion disposed between the second support plate and the curved portion, and a stiffness of the first reverse curvature portion is different from a stiffness of the second reverse curvature portion.

20 Claims, 24 Drawing Sheets

(56) References Cited

U.S. PATENT DOCUMENTS

| | | | |
|---|---|---|---|
| 2022/0343809 A1* | 10/2022 | Chen | G06F 1/1656 |
| 2023/0018777 A1* | 1/2023 | Park | G06F 1/1656 |
| 2023/0050666 A1* | 2/2023 | Li | G06F 1/1637 |

* cited by examiner

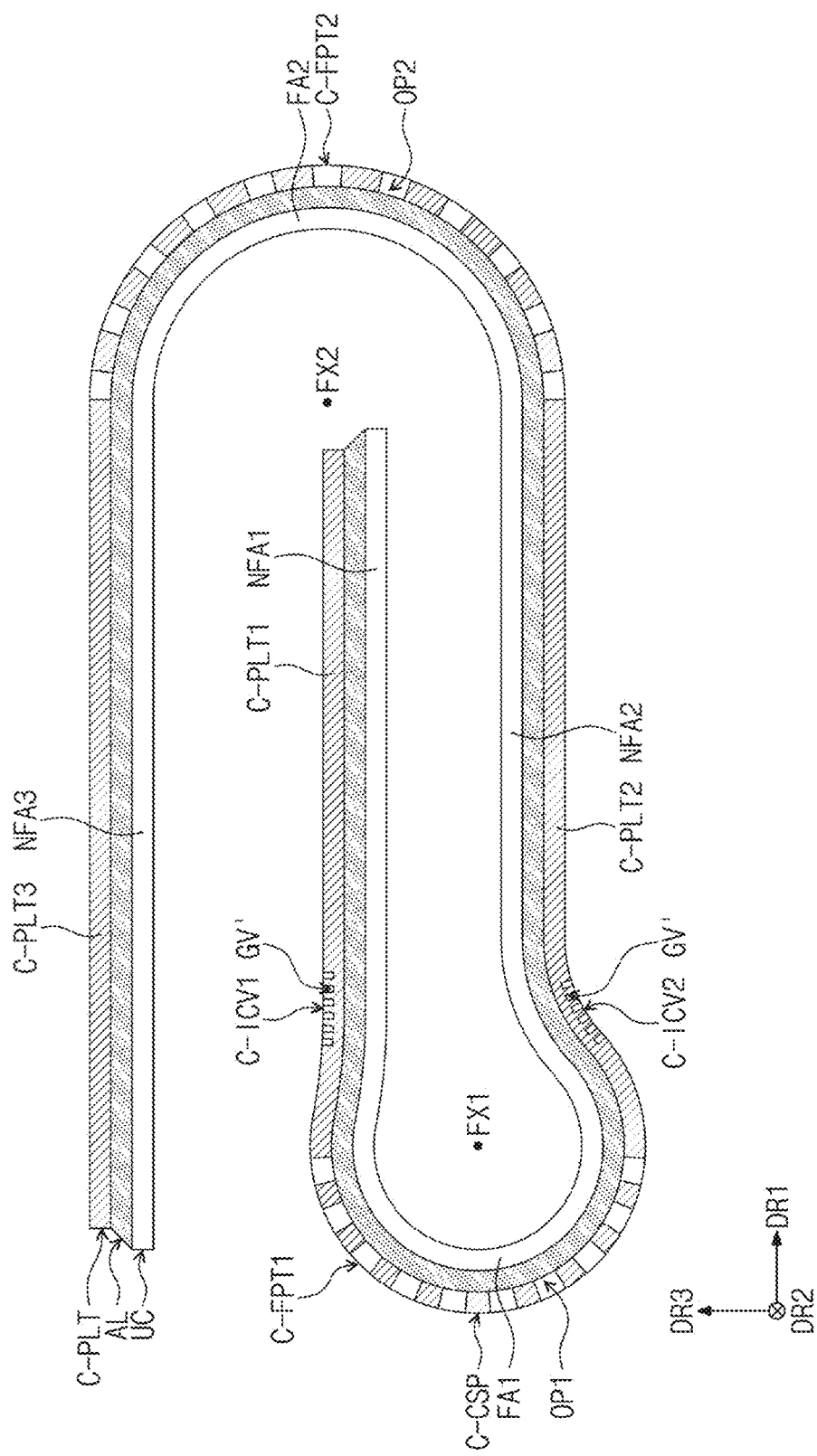

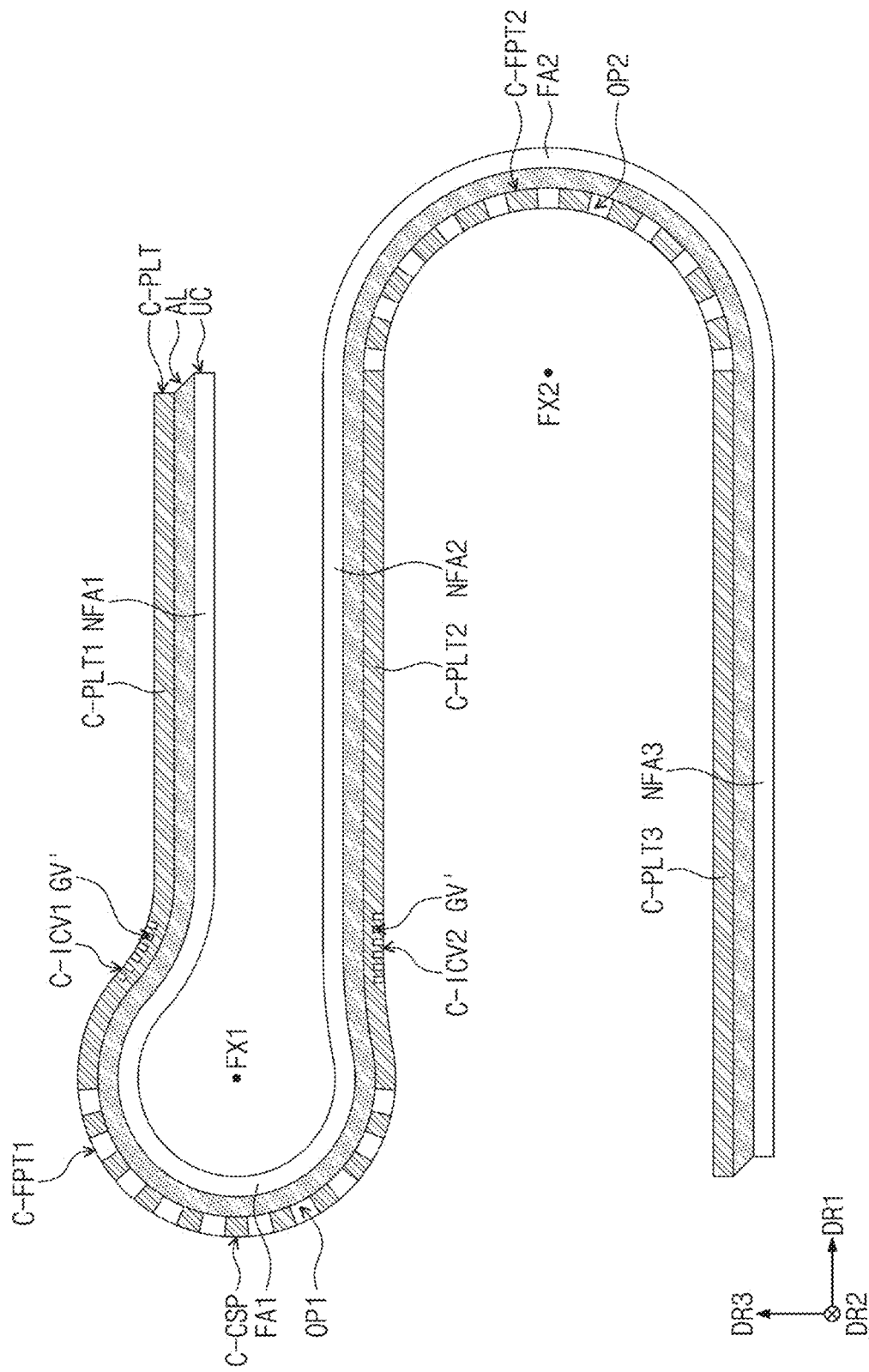

DISPLAY DEVICE

This application claims priority to Korean Patent Application No. 10-2022-0080034, filed on Jun. 29, 2022, and all the benefits accruing therefrom under U.S.C. § 119, the content of which in its entirety is herein incorporated by reference.

BACKGROUND

1. Field

The disclosure herein relates to a display device.

2. Description of the Related Art

In general, electronic devices such as a smart phone, a digital camera, a laptop computer, a navigation system, and a smart television which provide images to users include display devices for displaying images. The display devices generate images and provide the images to users through display screens.

In recent years, various flexible display devices configured to be curvedly deformed, folded, or rolled have been developed. The flexible display devices may be highly portable and more user friendly.

Among the flexible display devices, a multi-folding display device configured to be folded at least two times may be folded with respect to a plurality of folding axes. The display device may include a display module and a support portion disposed below the display module and supporting the display module.

SUMMARY

In a multi-folding display device including a display module and a support portion, when folding regions of the support portion, which overlap folding axes, are folded, the display module is folded along with the support portion. The folding regions may be deformed in shape due to various factors. Accordingly, it is desired to prevent the deformation of the folding regions.

The disclosure provides a display device in which deformation of a folding plate of a support plate is prevented.

An embodiment of the invention provides a display device including: a display module; and a support plate disposed below the display module and including a first support plate, a second support plate, and a first folding plate disposed between the first support plate and the second support plate, wherein the first folding plate includes: a curved portion; a first reverse curvature portion disposed between the first support plate and the curved portion; and a second reverse curvature portion disposed between the second support plate and the curved portion, and a stiffness of the first reverse curvature portion is different from a stiffness of the second reverse curvature portion.

In an embodiment of the invention, a display device includes: a display module; and a support plate disposed below the display module and including a first support plate, a second support plate, and a first folding plate disposed between the first support plate and the second support plate, wherein the first folding plate includes: a curved portion in which a plurality of first openings is defined; a first reverse curvature portion disposed between the first support plate and the curved portion; and a second reverse curvature portion disposed between the second support plate and the curved portion, a plurality of first grooves are defined on a rear surface of the first reverse curvature portion, a plurality of second grooves is defined on a rear surface of the second reverse curvature portion, and each of the first grooves has a different size from each of the second grooves.

In an embodiment of the invention, a display device includes: a display module; and a support plate disposed below the display module, where the support plate includes: a first support plate; a second support plate; and a first folding plate disposed between the first support plate and the second support plate, where the first folding plate is foldable in a dumbbell shape. In such an embodiment, the first folding plate includes: a curved portion bent to have a predetermined curvature when the first folding plate is folded in the dumbbell shape; a first reverse curvature portion disposed between the first support plate and the curved portion, where the first reverse curvature portion is bent opposite to the curved portion when the first folding plate is folded in the dumbbell shape; and a second reverse curvature portion disposed between the second support plate and the curved portion, where the second reverse curvature portion is bent opposite to the curved portion when the first folding plate is folded in the dumbbell shape, where a stiffness of the first reverse curvature portion is different from a stiffness of the second reverse curvature portion.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings:

FIGS. 16A and 16B are views showing a support plate of a display device according to Comparative Example;

FIGS. 20A and 20B are views showing a support plate of a display device according to Comparative Example.

DETAILED DESCRIPTION

Figure 1:
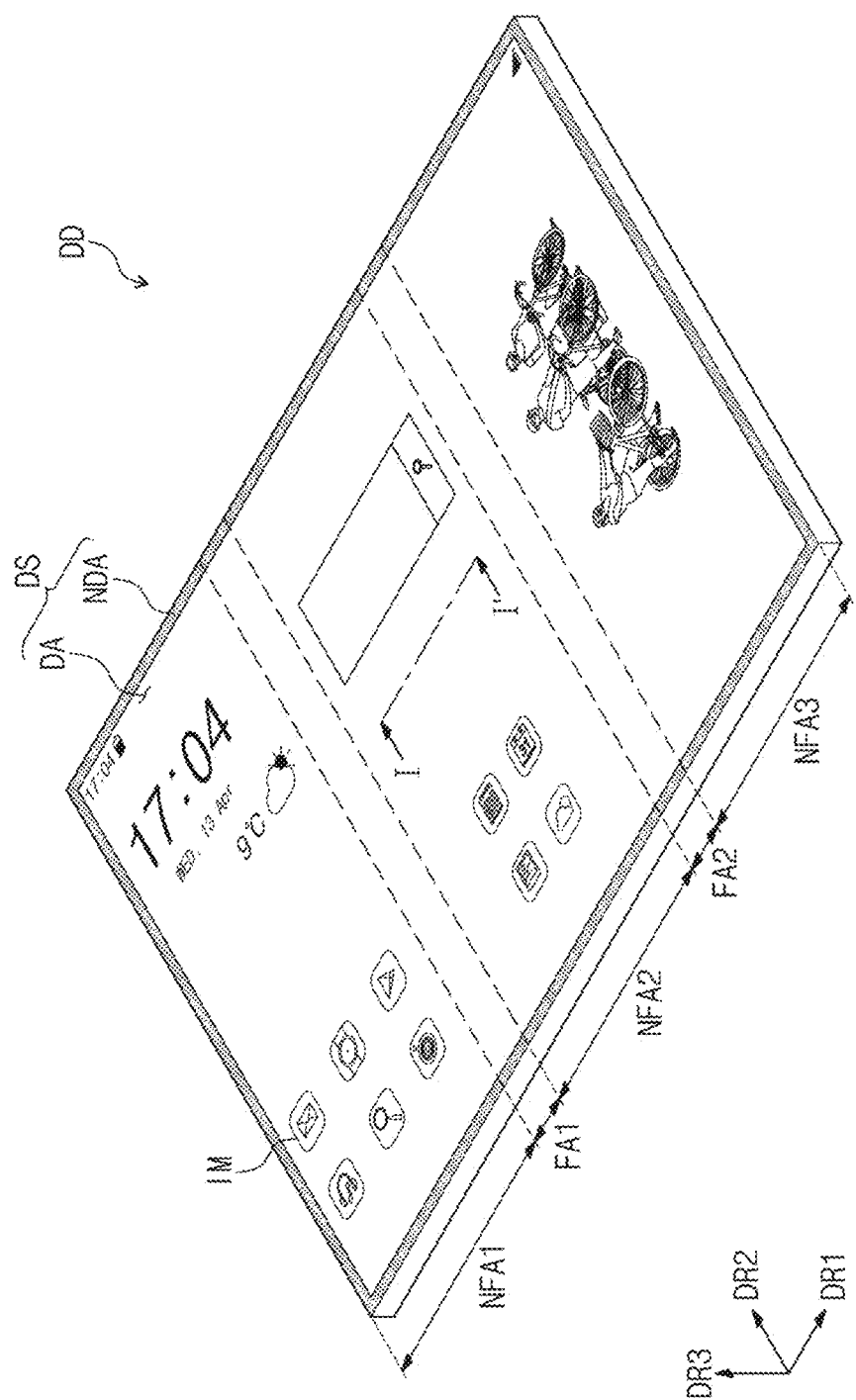
FIG. 1 is a perspective view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

As used herein, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. In addition, in the drawings, the thickness, the ratio, and the dimensions of elements are exaggerated for an effective description of technical contents.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, etc. may be used herein to describe various elements, these elements should not be limited by these terms. These terms are only used to distinguish one element from another element. For example, a first element may be referred to as a second element, and similarly, a second element may be referred to as a first element without departing from the teachings of the disclosure. The singular forms are intended to include the plural forms as well, unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the disclosure pertains. It is also to be understood that terms defined in commonly used dictionaries should be interpreted as having meanings consistent with the meanings in the context of the related art, and are expressly defined herein unless they are interpreted in an ideal or overly formal sense.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a perspective view of a display device according to an embodiment of the invention.

Referring to FIG. 1, a display device DD according to an embodiment of the invention may have a rectangular shape which has long sides extending in a first direction DR1 and has short sides extending in a second direction DR2 crossing the first direction DR1. However, the embodiment of the invention is not limited thereto, and alternatively, the display device DD may have various shapes such as a circular shape and a polygonal shape. The display device DD may be a flexible display device.

Hereinafter, a direction substantially perpendicularly to a plane defined by the first direction DR1 and the second direction DR2 is defined as a third direction DR3. The third direction DR3 may be a thickness direction of the display device DD. In addition, in the disclosure, "when viewed on a plane" or "when viewed in a plane view in the third direction DR3" may be defined as a state viewed in the third direction DR3.

The display device DD may include a plurality of non-folding regions NFA1, NFA2, and NFA3 and a plurality of folding regions FA1 and FA2 disposed between the non-folding regions NFA1, NFA2, and NFA3. The non-folding regions NFA1, NFA2, and NFA3 may include a first non-folding region NFA1, a second non-folding region NFA2, and a third non-folding region NFA3, which are arranged in the first direction DR1.

The folding regions FA1 and FA2 may include a first folding region FA1 and a second folding region FA2, which are arranged in the first direction DR1. The first folding region FA1 may be disposed between the first non-folding region NFA1 and the second non-folding region NFA2. The second folding region FA2 may be disposed between the second non-folding region NFA2 and the third non-folding region NFA3.

FIG. 1 shows an embodiment including two folding regions FA1 and FA2 and three non-folding regions NFA1, NFA2 and NFA3, but the embodiment of the invention is not limited thereto, and alternatively, the display device DD may include more folding regions and non-folding regions.

An upper surface of the display device DD may be defined as a display surface DS, and the display surface DS may be defined on a plane defined by the first direction DR1 and the second direction DR2. Images IM generated in the display device DD may be provided to a user through the display surface DS.

The display surface DS may include a display region DA and a non-display region NDA around the display region DA. The display region DA may display images, and the non-display region NDA may not display images. The non-display region NDA surrounds the display region DA, and may define an edge of the display device DD printed in a predetermined color.

Although not shown, the display device DD may include at least one sensor and at least one camera.

Figure 2:
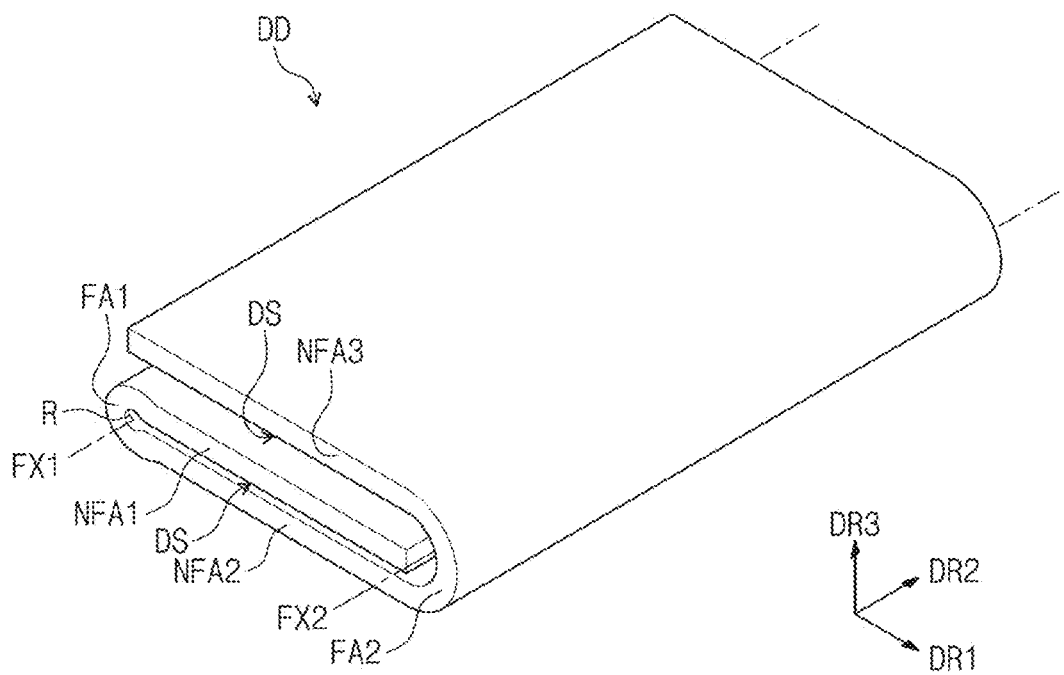
FIG. 2 is a view showing the display device shown in FIG. 1 in a folded state.

FIG. 2 is a view showing the display device shown in FIG. 1 in a folded state.

Referring to FIGS. 1 and 2, an embodiment of the display device DD may be a foldable display device DD which is folded or unfolded. The display device DD may be a multi-folding display device that is foldable with respect to a plurality of folding axes FX1 and FX2.

The first folding region FA1 may be bent with respect to a first folding axis FX1 parallel to the second direction DR2, and the second folding region FA2 may be bent with respect to a second folding axis FX2 parallel to the second direction DR2, so that the display device DD may be folded. The first and second folding axes FX1 and FX2 may be defined as short axes parallel to a short side of the display device DD.

When the display device DD is folded or in the folded state, the first non-folding region NFA1 and the second non-folding region NFA2 may face each other, and the third non-folding region NFA3 may be disposed on the first non-folding region NFA1 to face the first non-folding region NFA1. The first non-folding region NFA1 may be disposed between the second non-folding region NFA2 and the third non-folding region NFA3 when the display device DD in the folded state.

The display device DD may be in-folded such that the display surface DS is not exposed to the outside. The first folding region FA1 and the first and second non-folding regions NFA1 and NFA2 may be in-folded. In an embodiment, for example, when the first folding region FA1 is folded, the display surface DS of the first non-folding region NFA1 and the display surface DS of the second non-folding region NFA2 may be disposed to face each other and may thus not be exposed to the outside.

The second folding region FA2 and the second and third non-folding regions NFA2 and NFA3 may be in-folded. In an embodiment, for example, when the second folding region FA2 is folded, the display surface DS of the third non-folding region NFA3 may be disposed to face a rear surface of the first non-folding region NFA1 opposite to the display surface DS of the first non-folding region NFA1 and may thus not be exposed to the outside.

In an embodiment, the distance between the first non-folding region NFA1 and the second non-folding region NFA2 may be smaller than a diameter of a circle defined by a radius of curvature R of the first folding region FA1 when the display device DD in the folded state. In this case, the first folding region FA1 may be folded in a dumbbell shape, and the distance between the first non-folding region NFA1 and the second non-folding region NFA2 may become shorter as being away from the first folding region FA1.

The second folding region FA2 may be folded in a "U-like" shape. The distance between the first non-folding region NFA1 and the third non-folding region NFA3 may be greater than the distance between the first non-folding region NFA1 and the second non-folding region NFA2 when the display device DD in the folded state.

Figure 3:
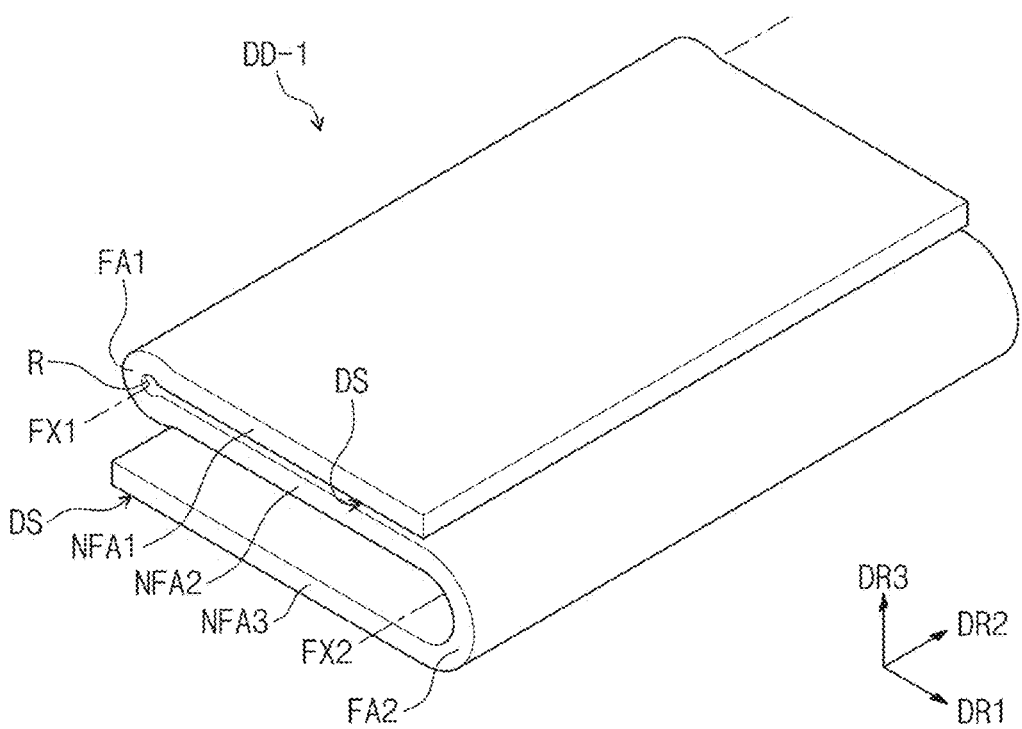
FIG. 3 is a view showing a display device according to an alternative embodiment of the invention in a folded state.

FIG. 3 is a view showing a display device according to an alternative embodiment of the invention in a folded state.

Referring to FIG. 3, an alternative embodiment of a display device DD-1 may be the same as the embodiment of the display device DD shown in FIGS. 1 and 2 except for the folded state. In such an embodiment, for example, as described above with reference to the display device DD shown in FIG. 1, the display device DD-1 may include first and second folding regions FA1 and FA2 and first, second, and third non-folding regions NFA1, NFA2, and NFA3.

The first folding region FA1 may be folded in a dumbbell shape with respect to the first folding axis FX1. The second folding region FA2 may be folded in a "U-like" shape with respect to the second folding axis FX2.

When the display device DD-1 is folded, the first non-folding region NFA1 and the second non-folding region NFA2 may face each other, and the third non-folding region NFA3 may be disposed below the second non-folding region NFA2 to face the second non-folding region NFA2. The second non-folding region NFA2 may be disposed between the first non-folding region NFA1 and the third non-folding region NFA3 when the display device DD-1 is in the folded state.

The first folding region FA1 and the first and second non-folding regions NFA1 and NFA2 may be in-folded. In an embodiment, for example, when the first folding region FA1 is folded, the display surface DS of the first non-folding region NFA1 and the display surface DS of the second non-folding region NFA2 may be disposed to face each other and may thus not be exposed to the outside.

The second folding region FA2 and the second and third non-folding regions NFA2 and NFA3 may be out-folded. In an embodiment, for example, when the second folding region FA2 is folded, the display surface DS of the third non-folding region NFA3 may not face a rear surface of the second non-folding region NFA2 and may be exposed to the outside.

Figure 4:
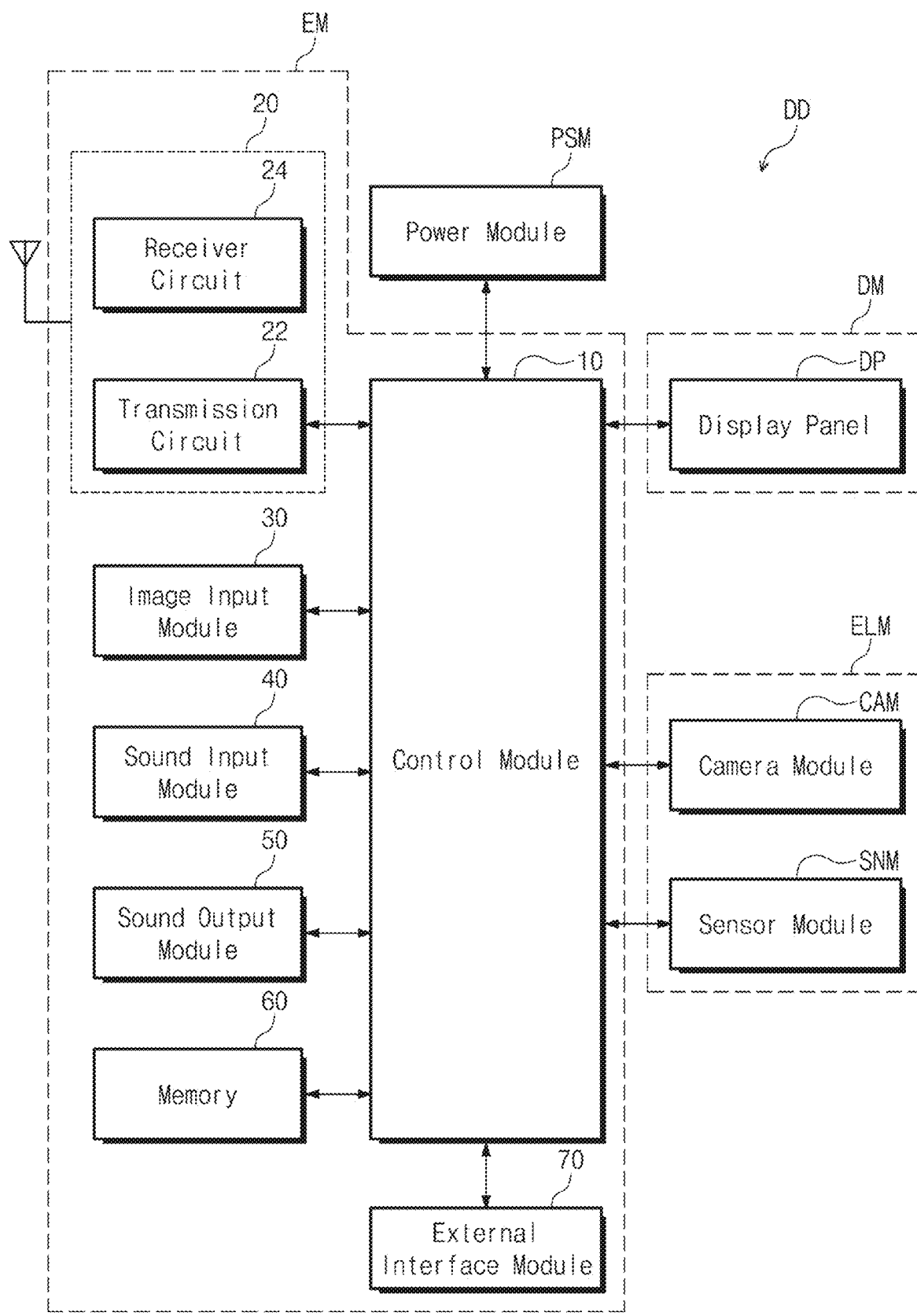
FIG. 4 is a block diagram of the display device shown in FIG. 1.

FIG. 4 is a block diagram of the display device shown in FIG. 1.

Referring to FIG. 4, an embodiment of the display device DD may include an electronic module EM, a power module PSM, a display module DM, and an electro-optical module ELM. The electronic module EM may include a control module 10, a wireless communication module 20, an image input module 30, a sound input module 40, a sound output module 50, a memory 60, an external interface module 70, or the like. The modules of the display device DD may be mounted on a circuit board or electrically connected to another module through a flexible circuit board. The electronic module EM may be electrically connected to the power module PSM.

The control module 10 may control the overall operation of the display device DD. In an embodiment, for example, the control module 10 may activate or deactivate the display module DM in accordance with user inputs. The control module 10 may control the image input module 30, the sound input module the sound output module 50, or the like in accordance with user inputs. The control module 10 may include at least one microprocessor.

The wireless communication module 20 may transmit/receive wireless signals to/from another terminal, using a Bluetooth® or Wi-Fi line. The wireless communication module 20 may transmit/receive voice signals, using a general communication line. The wireless communication module 20 may include a transmission circuit 22 that modulates signals to be transmitted and transmits the signals, and a receiver circuit 24 that demodulates received signals.

The image input module 30 may process image signals and convert the signals into image data that are displayable on (or corresponding to the interface specification of) the display module DM. The sound input module 40 may receive external sound signals through a microphone in a recording mode or a voice recognition mode and convert the signals into electrical voice data. The sound output module 50 may convert sound data received from the wireless communication module 20 or sound data stored in the memory 60, and output the converted sound data to the outside.

The external interface module 70 may serve as an interface connected to an external charger, a wired/wireless data port, a card socket (e.g., a memory card, a SIM/UIM card), and the like.

The power module PSM may supply power used for the overall operation of the display device DD. The power module PSM may include a typical battery device.

The display module DM may include a display panel DP including a plurality of pixels for displaying images. The display panel DP may be driven under the control of the control module 10 to generate images.

The electro-optical module ELM may be an electronic component that outputs or receives optical signals. The electro-optical module ELM may transmit or receive optical signals through a partial region of the display module DM. In an embodiment, the electro-optical module ELM may include a camera module CAM and a sensor module SNM. The camera module CAM may include a camera. The sensor module SNM may include a sensor.

Figure 5:
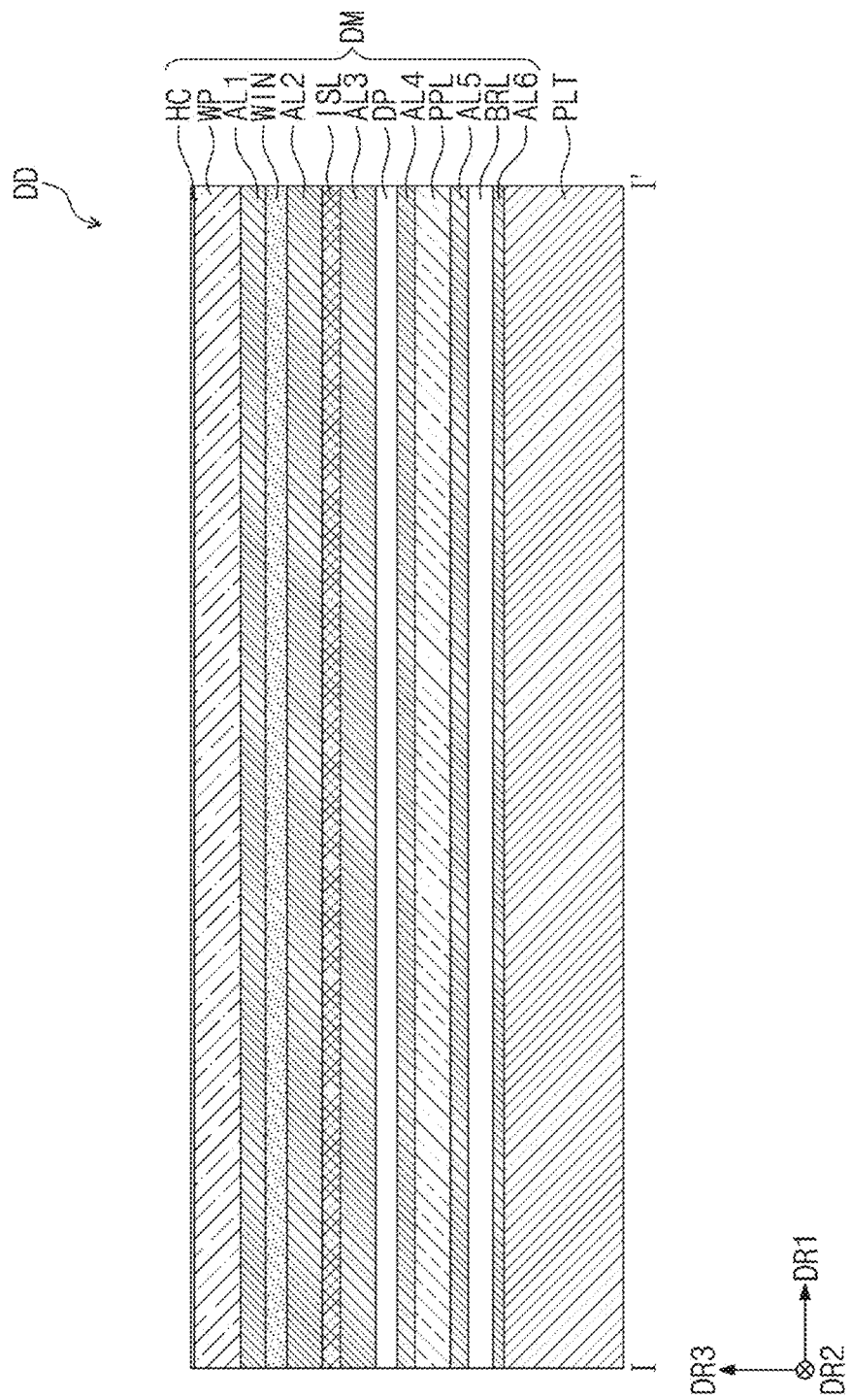
FIG. 5 is a cross-sectional view taken along line I-I' shown in FIG. 1, and a view showing a cross-section of a display device according to an embodiment of the invention.

FIG. 5 is a cross-sectional view taken along line I-I' shown in FIG. 1, and a view showing a cross-section of a display device according to an embodiment of the invention.

Referring to FIG. 5, an embodiment of the display device DD may include a display module DM, and a support plate PLT disposed below the display module DM. The display module DM may be a flexible display module. In such an embodiment, the support plate PLT may support the display module DM.

The display module DM includes a window WIN, a window protection layer WP, a hard coating layer HC, a shock absorbing layer ISL, a display panel DP, a panel protection layer PPL, a barrier layer BRL, and first to sixth adhesive layers AL1 to AL6.

The shock absorbing layer ISL may be disposed on the display panel DP. The shock absorbing layer ISL may absorb external shocks applied from the top of the display device DD towards the display panel DP to protect the display panel DP. The shock absorbing layer ISL may be prepared in the form of a stretched film.

The shock absorbing layer ISL may include a flexible plastic material. The flexible plastic material may be defined as a synthetic resin film. In an embodiment, for example, the shock absorbing layer ISL may include a flexible plastic material such as polyimide (PI) or polyethylene terephthalate (PET).

The window WIN may be disposed on the shock absorbing layer ISL. The window WIN may protect the display panel DP from external scratches. The window WIN may have optically transparent properties. The window WIN may include glass. However, the embodiment of the invention is not limited thereto, and alternatively, the window WIN may include a synthetic resin film.

The window WIN may have a multi-layer structure or a single-layer structure. In an embodiment, for example, the window WIN may include a plurality of synthetic resin films bonded with an adhesive, or a glass substrate and a synthetic resin film bonded with an adhesive.

The window protection layer WP may be disposed on the window WIN. The window protection layer WP may include a flexible plastic material such as polyimide or polyethylene terephthalate. The hard coating layer HC may be disposed on an upper surface of the window protection layer WP.

The panel protection layer PPL may be disposed below the display panel DP. The panel protection layer PPL may protect a lower portion of the display panel DP. The panel protection layer PPL may include a flexible plastic material. In an embodiment, for example, the panel protection layer PPL may include polyethylene terephthalate (PET).

The barrier layer BRL may be disposed below the panel protection layer PPL. The barrier layer BRL may increase resistance against compressive force caused by external pressing. Therefore, the barrier layer BRL may serve to prevent the deformation of the display panel DP. The barrier layer BRL may include a flexible plastic material such as polyimide or polyethylene terephthalate.

The barrier layer BRL may have a color which absorbs light. In an embodiment, for example, the barrier layer BRL may be black in color. In such an embodiment, when the display module DM is viewed from above the display module DM, elements disposed below the barrier layer BRL may not be viewable.

The first adhesive layer AL1 may be disposed between the window protection layer WP and the window WIN. In such an embodiment, the window protection layer WP and the window WIN may be bonded to each other by the first adhesive layer AL'.

The second adhesive layer AL2 may be disposed between the window WIN and the shock absorbing layer ISL. In such an embodiment, the window WIN and the shock absorbing layer ISL may be bonded to each other by the second adhesive layer AL2.

The third adhesive layer AL3 may be disposed between the shock absorbing layer ISL and the display panel DP. In such an embodiment, the shock absorbing layer ISL and the display panel DP may be bonded to each other by the third adhesive layer AL3.

The fourth adhesive layer AL4 may be disposed between the display panel DP and the panel protection layer PPL. In such an embodiment, the display panel DP and the panel protection layer PPL may be bonded to each other by the fourth adhesive layer AL4.

The fifth adhesive layer AL5 may be disposed between the panel protection layer PPL and the barrier layer BRL. In such an embodiment, the panel protection layer PPL and the barrier layer BRL may be bonded to each other by the fifth adhesive layer AL5.

The sixth adhesive layer AL6 may be disposed between the barrier layer BRL and the support plate PLT. In such an embodiment, the barrier layer BRL and the support plate PLT may be bonded to each other by the sixth adhesive layer AL6.

The first to sixth adhesive layers AL1 to AL6 may include a transparent adhesive, such as a pressure sensitive adhesive (PSA) or an optically clear adhesive (OCA), but the type of the adhesive is not limited thereto.

Hereinafter, in the description, a "thickness" may indicate a numerical value measured in the third direction DR3.

A thickness of the panel protection layer PPL is smaller than a thickness of the window protection layer WP, and a thickness of the barrier layer BRL may be smaller than the thickness of the panel protection layer PPL. A thickness of the display panel DP is smaller than the thickness of the barrier layer BTU, and may be equal to a thickness of the window WIN. A thickness of the shock absorbing layer ISL may be smaller than the thickness of the display panel DP.

A thickness of the third adhesive layer AL1 may be equal to the thickness of the barrier layer BRL, and a thickness of each of the second adhesive layer AL2 and the third adhesive layer AL3 may be equal to the thickness of the panel protection layer PPL. A thickness of the four adhesive layer AL4 may be equal to a thickness of the fifth adhesive layer AL5.

The thickness of each of the fourth adhesive layer AL4 and the fifth adhesive layer AL5 may be smaller than the thickness of the display panel DP and greater than the thickness of the shock absorbing layer ISL. A thickness of the sixth adhesive layer AL6 may be smaller than the thickness of the shock absorbing layer ISL. A thickness of the hard coating layer HC may be smaller than the thickness of the sixth adhesive layer AL6.

The support plate PLT may be disposed below the display panel DP to support the display panel DP. The support plate PLT may include a non-metal material. In an embodiment, for example, the support plate PLT may include a reinforcing fiber composite material.

The reinforcing fiber composite material may be carbon fiber reinforced plastic (CFRP) or glass fiber reinforced plastic (GFRP). However, the embodiment of the invention is not limited thereto, and alternatively, the support plate PLT may include a metal material such as stainless steel.

The support plate PLT may include a reinforcing fiber composite material to be lightweight. The support plate PLT according to an embodiment may include a reinforcing fiber composite material, and thus be lightweight compared to a metal support plate using a metal material, and may have a modulus and strength similar to that of the metal support plate.

The support plate PLT may include a reinforcing fiber composite material, and shape processing of the support plate PLT may thus be easier compared to the metal support plate. In an embodiment, for example, the support plate PLT including a reinforcing fiber composite material may be more easily processed through a laser process or a microblast process. Openings and grooves of the support plate PLT, which will be described later with reference to FIGS. 11 to 13, may be formed through such a process.

Figure 6:
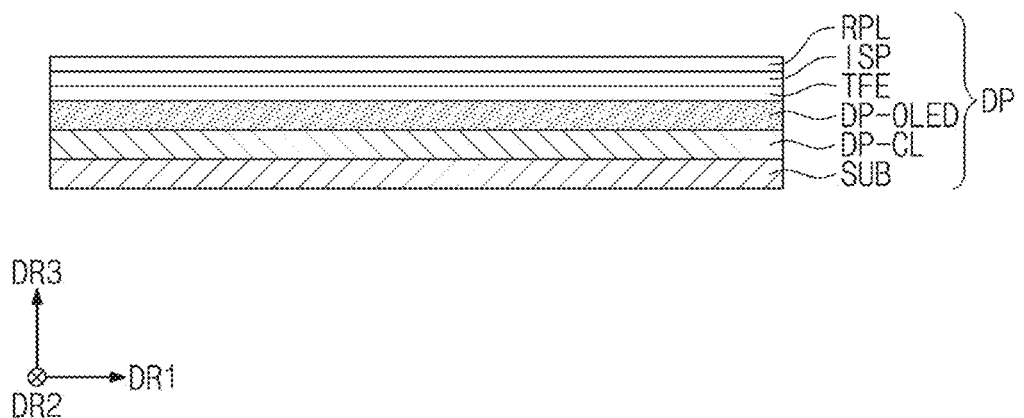
FIG. 6 is a cross-sectional view schematically showing a display panel shown in FIG. 5.

FIG. 6 is a cross-sectional view schematically showing a display panel shown in FIG. 5.

Referring to FIG. 6, the display panel DP may be a flexible display panel. The display panel DP according to an embodiment of the invention may be a light emitting display panel, and is not particularly limited. In an embodiment, for example, the display panel DP may be an organic light emitting display panel or an inorganic light emitting display panel. An emission layer of the organic light emitting display panel may include an organic light emitting material. An emission layer of the inorganic light emitting display panel may include quantum dots, quantum rods, etc. Hereinafter, for convenience of description, embodiments where the display panel DP is an organic light emitting display panel will be described in detail.

The display panel DP may include a substrate SUB, a circuit element layer DP-CL, a display element layer DP-OLED, a thin film encapsulation layer TFE, an input sensing unit ISP, and a reflection prevention layer RPL. The substrate SUB may include a flexible plastic material. In an embodiment, for example, the substrate SUB may include polyimide (PI).

The display element layer DP-OLED may be disposed on the circuit element layer DP-CL. The circuit element layer DP-CL may include transistors. The display element layer DP-OLED may include light emitting elements connected to transistors.

The thin film encapsulation layer TFE may be disposed on the display element layer DP-OLED. The thin film encapsulation layer TFE may serve to protect light emitting elements from moisture/oxygen, and foreign substances such as dust particles.

The input sensing unit ISP may be disposed on the thin film encapsulation layer TFE. The input sensing unit ISP may include a plurality of sensors (not shown) for sensing external inputs. The sensors may sense the external inputs in a capacitive manner. The input sensing unit ISP may be directly formed on the thin film encapsulation layer TFE, when manufacturing the display panel DP. However, the embodiment of the invention is not limited thereto, and alternatively, the input sensing unit ISP may be manufactured as a separate panel, and be bonded to the thin film encapsulation layer TFE through an adhesive layer.

The reflection prevention layer RPL may be disposed on the input sensing unit ISP. The reflection prevention layer RPL may be directly formed on the input sensing unit ISP when the display panel DP is manufactured. The reflection prevention layer RPL may be defined as an external light anti-reflection film. The reflection prevention layer RPL may reduce the reflectance of external light incident from the top of the display device DD towards the display panel DP.

Figure 7:
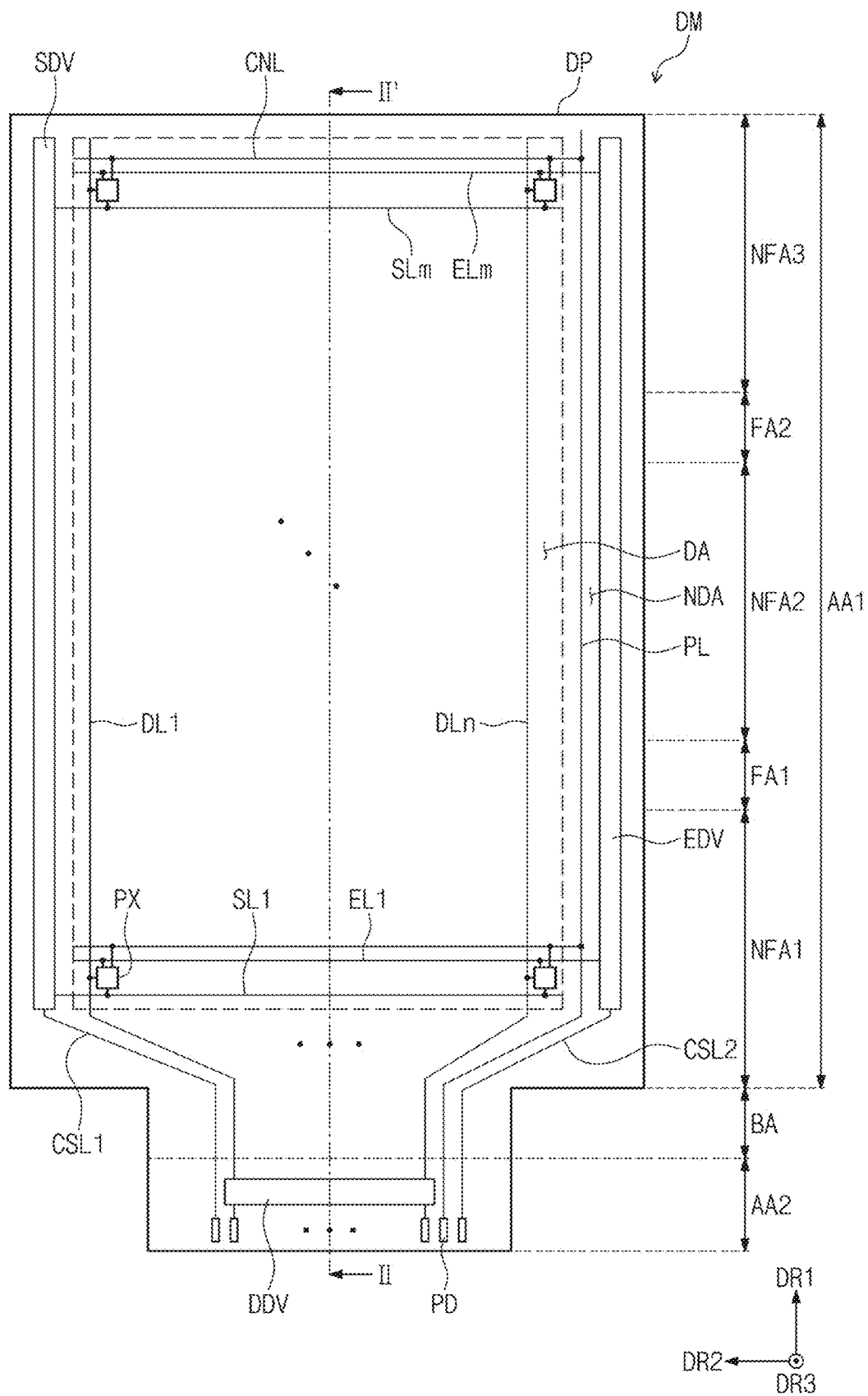
FIG. 7 is a plan view of the display panel shown in FIG. 5.

FIG. 7 is a plan view of the display panel shown in FIG. 5.

Referring to FIG. 7, an embodiment of the display module DM may include a display panel DP, a scan driver SDV, a data driver DDV, and an emission driver EDV.

The display panel DP may include a first region AA1, a second region AA2, and a bending region BA between the first region AA1 and the second region AA2. The bending region BA may extend in the second direction DR2, and the first region AA1, the bending region BA, and the second region AA2 may be arranged in the first direction DR1.

The first region AA1 may include the display region DA and the non-display region NDA around the display region DA. The non-display region NDA may surround the display region DA. The display region DA may be a region which displays an image, and the non-display region NDA may be a region which does not display an image. The second region AA2 and the bending region BA may be regions which do not display an image.

The first region AA1 may include the first, second, and third non-folding regions NFA1, NFA2, and NFA3 and the first and second folding regions FA1 and FA2, each extending in the second direction DR2. The first, second, and third non-folding regions NFA1, NFA2, and NFA3 and the first and second folding regions FA1 and FA2 may correspond to the first, second, and third non-folding regions NFA1, NFA2, and NFA3 and the first and second folding regions FA1 and FA2 of the display device DD shown in FIG. 1. The first region AA1 may be bendable or foldable with respect to the first and second folding axes FX1 and FX2 described above. In an embodiment, for example, as the first and second folding regions FA1 and FA2 of the first region AA1 are folded with respect to the first and second folding axes FX1 and FX2 described above, the display panel DP may be multi-folded.

The display panel DP may include a plurality of pixels PX, a plurality of scan lines SL1 to SLm, a plurality of data lines DL1 to DLn, a plurality of light emission lines EL1 to ELm, first and second control lines CSL1 and CSL2, a power line PL, a plurality of connection lines CNL, and a plurality of pads PD. m and n are natural numbers. The pixels PX are disposed in the display region DA, and may be connected to the scan lines SL1 to SLm, the data lines DL1 to DLn, and the emission lines EL1 to ELm.

The scan driver SDV and the emission driver EDV may be disposed in the non-display region NDA. The scan driver SDV and the emission driver EDV may be disposed in the non-display region NDA adjacent to opposing sides of the first region AA1, which are opposite to each other in the second direction DR2. The data driver DDV may be disposed in the second region AA2. The data driver DDV may be manufactured in the form of an integrated circuit chip and mounted on the second region AA2.

The scan lines SL1 to SLm may extend in the second direction DR2 and be connected to the scan driver SDV. The data lines DL1 to DLn may extend in the first direction DR1 and be connected to the data driver DDV via the bending region BA. The data driver DDV may be connected to the pixels PX through the data lines DL1 to DLn. The emission lines EL1 to ELm may extend in the second direction DR2 and be connected to the emission driver EDV.

The power line PL may extend in the first direction DR1 and be disposed in the non-display region NDA. Although the power line PL may be disposed between the display region DA and the emission driver EDV, the embodiment of the invention is not limited thereto, and alternatively, the power line PL may be disposed between the display region DA and the scan driver SDV.

The power line PL may extend to the second region AA2 via the bending region BA. When viewed on a plane, the first power line PL2 may extend towards a lower end of the second region AA2. The power line PL may receive a driving voltage.

The connection lines CNL may extend in the second direction DR2 and arranged in the first direction DR1. The connection lines CNL may be connected to the power line PL and the pixels PX. The driving voltage may be applied to the pixels PX through the power line PL1 and the connection lines CNL connected to each other.

The first control line CSL1 is connected to the scan driver SDV, and may extend toward the lower end of the second region AA2 via the bending region BA. The second control line CSL2 is connected to the emission driver EDV, and may extend toward the lower end of the second region AA2 via the bending region BA. The data driver DDV may be disposed between the first control line CSL1 and the second control line CSL2.

When viewed on a plane, the pads PD may be disposed adjacent to the lower end of the second region AA2. The data driver DDV, the power line PL, the first control line CSL1, and the second control line CSL2 may be connected to the pads PD.

The data lines DL1 to DLn may be connected to corresponding pads PD through the data driver DDV. In an embodiment, for example, the data lines DL1 to DLn may be connected to the data driver DDV, and the data driver DDV may be connected to the pads PD respectively corresponding to the data lines DL1 to DLn.

Although not shown, a printed circuit board may be connected to the pads PD, and a timing controller and a voltage generator may be disposed on the printed circuit board. The timing controller may be manufactured as an integrated circuit chip and mounted on the printed circuit board. The timing controller and the voltage generator may be connected to the pads PD through the printed circuit board.

The timing controller may control the operation of the scan driver SDV, the data driver DDV, and the emission driver EDV. The timing controller may generate a scan control signal, a data control signal, and an emission control signal in response to control signals received from the outside. The voltage generator may generate a driving voltage.

The scan control signal may be provided to the scan driver SDV through the first control line CSL1. The emission control signal may be provided to the emission driver EDV through the second control line CSL2. The data control signal may be provided to the data driver DDV. The timing controller receives image signals from the outside, and may convert the data format of the image signals to match interface specifications with the data driver DDV and provide the image signals with converted data format to the data driver DDV.

The scan driver SDV may generate a plurality of scan signals in response to the scan control signal. The scan signals may be applied to the pixels PX through the scan lines SL1 to SLm. The scan signals may be sequentially applied to the pixels PX.

The data driver DDV may generate a plurality of data voltages corresponding the image signals in response to the data control signal. The data voltages may be applied to the pixels PX through the data lines DL1 to DLn. The emission driver EDV may generate a plurality of emission signals in response to the emission control signal. The emission signals may be applied to the pixels PX through the emission lines EL1 to ELm.

The pixels PX may be provided with the data voltages in response to the scan signals. The pixels PX may display an image by emitting light of luminance corresponding to the data voltages in response to the emission signals. The emission duration of the pixels PX may be controlled by the emission signals.

Figure 8:
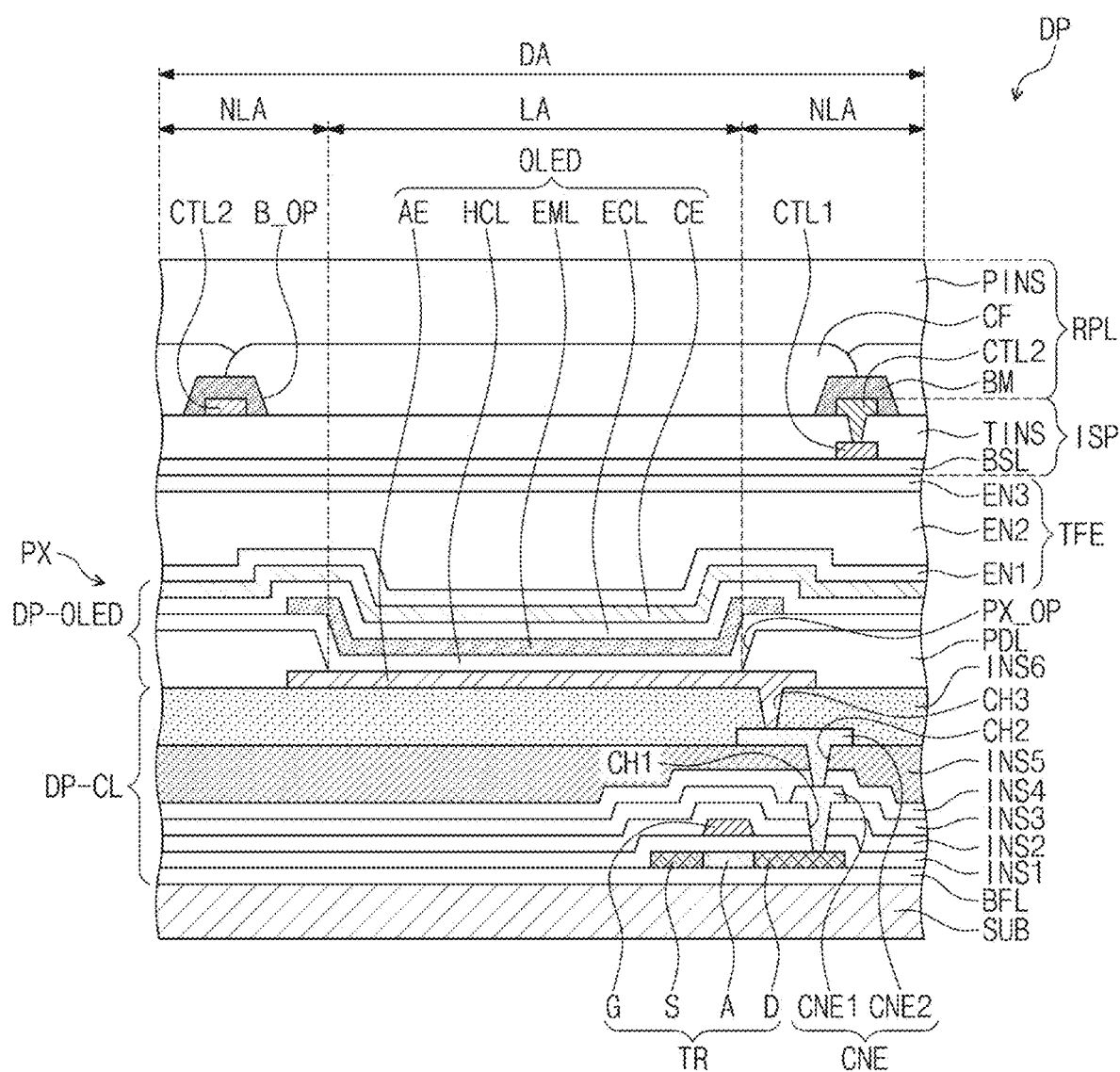
FIG. 8 is a view showing a cross-section of the display panel corresponding to any one pixel shown in FIG. 7 according to an embodiment of the invention.

FIG. 8 is a view showing a cross-section of the display panel corresponding to one pixel shown in 7 according to an embodiment of the invention.

Referring to FIG. 8, in an embodiment, a pixel PX may include a transistor TR and a light emitting element OLED. The light emitting element OLED may include a first electrode AE (or an anode), a second electrode CE (or a cathode), a hole control layer HCL, an electron control layer ECL, and an emission layer EML.

The transistor TR and the light emitting element OLED may be disposed on a substrate SUB. Although one transistor TR of the pixel PX is shown in FIG. 8 as an example, the pixel PX may include a plurality of transistors and at least one capacitor for driving the light emitting element OLED.

The display region DA may include a light emitting region LA corresponding to each of the pixels PX and a non-light emitting region NLA around the light emitting region LA. The light emitting element OLED may be disposed in the light emitting region LA.

A buffer layer BFL is disposed on the substrate SUB, and the buffer layer BFL may be an inorganic layer. A semiconductor pattern may be disposed on the buffer layer BFL. The semiconductor pattern may include polysilicon, amorphous silicon, or metal oxide.

The semiconductor pattern may be doped with an N-type dopant or a P-type dopant. The semiconductor pattern may include a heavily doped region and a lightly doped region.

The heavily doped region has greater conductivity than the lightly doped region, and may substantially serve as a source electrode and a drain electrode of the transistor TR. The lightly doped region may substantially correspond to an active A (or a channel) of the transistor TR.

A source S, the active A, and a drain D of the transistor TR may be formed from (or defined by portions of) the semiconductor pattern. A first insulating layer INS1 may be disposed on the semiconductor pattern. A gate G of the transistor TR may be disposed on the first insulating layer INS'. A second insulating layer INS2 may be disposed on the gate G. A third insulating layer INS3 may be disposed on the second insulating layer INS2.

The connection electrode CNE may include a first connection electrode CNE1 and a second connection electrode CNE2 to connect the transistor TR and the light emitting element OLED. The first connection electrode CNE1 may be disposed on the third insulating layer INS3 and be connected to the drain D through a first contact hole CH1 defined in the first to third insulating layers INS1 to INS3.

A fourth insulating layer INS4 may be disposed on the first connection electrode CNE1. A fifth insulating layer INS5 may be disposed on the fourth insulating layer INS4. The second connection electrode CNE2 may be disposed on the fifth insulating layer INS5. The second connection electrode CNE2 may be connected to the first connection electrode CNE1 through a second contact hole CH2 defined in the fourth and fifth insulating layers INS4 and INS5.

A sixth insulating layer INS6 may be disposed on the second connection electrode CNE2. A layer from the buffer layer BFL to the sixth insulating layer INS6 may be defined as a circuit element layer DP-CL. The first insulating layer INS1 to the sixth insulating layer INS6 may be an inorganic layer or an organic layer.

The first electrode AE may be disposed on the sixth insulating layer INS6. The first electrode AE may be connected to the second connection electrode CNE2 through a third contact hole CH3 defined in the sixth insulating layer INS6. A pixel defining film PDL, in which an opening PX_OP for exposing a predetermined portion of the first electrode AE is defined, may be disposed on the first electrode AE and the sixth insulating layer INS6.

The hole control layer HCL may be disposed on the first electrode AE and the pixel defining film PDL. The hole control layer HCL may include a hole transport layer and a hole injection layer.

The emission layer EML may be disposed on the hole control layer HCL. The emission layer EML may be disposed in a region corresponding to the opening PX_OP. The emission layer EML may include an organic material and/or an inorganic material. In an embodiment, the emission layer EML may generate red light, green light, or blue light. In an embodiment, for example, the emission layer EML may generate one of red light, green light, and blue light.

The electron control layer ECL may be disposed on the emission layer EML and the hole control layer HCL. The electron control layer ECL may include an electron transport layer and an electron injection layer. The hole control layer HCL and the electron control layer ECL may be commonly disposed in the light emitting region LA and the non-light emitting region NLA.

The second electrode CE may be disposed on the electron control layer ECL. The second electrode CE may be commonly disposed in the pixels PX. A layer on which the light emitting element OLED is disposed may be defined as the display element layer DP-OLED.

The thin film encapsulation layer TFE may be disposed on the second electrode CE to cover the pixels PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 and EN3 may include an inorganic insulating layer and may protect the pixels PX from moisture/oxygen. The second encapsulation layer EN2 may include an organic insulating layer and may protect the pixels PX from foreign substances such as dust particles.

A first voltage may be applied to the first electrode AE through the transistor TR, and a second voltage having a lower level than the first voltage may be applied to the second electrode CE. Holes and electrons injected into the emission layer EML combine to form excitons, and the excitons transition to a ground state, and accordingly the light emitting element OLED may emit light.

The input sensing unit ISP may be disposed on the thin film encapsulation layer TFE. The input sensing unit ISP may be directly manufactured or formed on an upper surface of the thin film encapsulation layer TFE.

A base layer BSL may be disposed on the thin film encapsulation layer TFE. The base layer BSL may include an inorganic insulating layer. At least one inorganic insulating layer may be provided as the base layer BSL, on the thin film encapsulation layer TFE.

The input sensing unit ISP may include a first conductive pattern CTL1 and a second conductive pattern CTL2 disposed on the first conductive pattern CTL1. The first conductive pattern CTL1 may be disposed on the base layer BSL. An insulating layer TINS may be disposed on the base layer BSL to cover the first conductive pattern CTL1. The insulating layer TINS may include an inorganic insulating layer or an organic insulating layer. The second conductive pattern CTL2 may be disposed on the insulating layer TINS.

The first and second conductive patterns CTL1 and CTL2 may overlap the non-light emitting region NLA. Although not shown, the first and second conductive patterns CTL1 and CTL2 may be disposed on the non-light emitting region NLA between the light emitting regions LA and may have a mesh shape.

The first and second conductive patterns CTL1 and CTL2 may form sensors of the input sensing unit ISP described above. In an embodiment, for example, the mesh-shaped first and second conductive patterns CTL1 and CTL2 may be separated from each other in a predetermined region to form sensors. A portion of the second conductive pattern CTL2 may be connected to the first conductive pattern CTL1.

The reflection prevention layer RPL may be disposed on the second conductive pattern CTL2. The reflection prevention layer RPL may include a black matrix BM and a plurality of color filters CF. The black matrix BM may overlap the non-light emitting region NLA, and the color filters CF may respectively overlap the light emitting regions LA.

The black matrix BM may be disposed on the insulating layer TINS to cover the second conductive pattern CTL2. An opening B_OP overlapping the light emitting region LA and the opening PX_OP may be defined in the black matrix BM. The black matrix BM may absorb and block light. The opening B_OP of the black matrix BM may have a greater width than the opening PX_OP of the pixel defining film PDL.

The color filters CF may be disposed on the insulating layer TINS and the black matrix BM. The color filters CF may each be disposed in the openings B_OP. A planarization insulating layer PINS may be disposed on the color filters CF. The planarization insulating layer PINS may provide a flat upper surface on the color filters CF.

When external light traveling toward the display panel DP is reflected from the display panel DP and provided again to an external user, like a mirror, the user may view the external light. In an embodiment, for example, the reflection prevention layer RPL may include a plurality of color filters that display same colors as the pixels PX of the display panel DP to prevent such a phenomenon. The color filters CF may filter external light to display the same colors as the pixels PX. In this case, the external light may not be viewable to the user.

Figure 9:
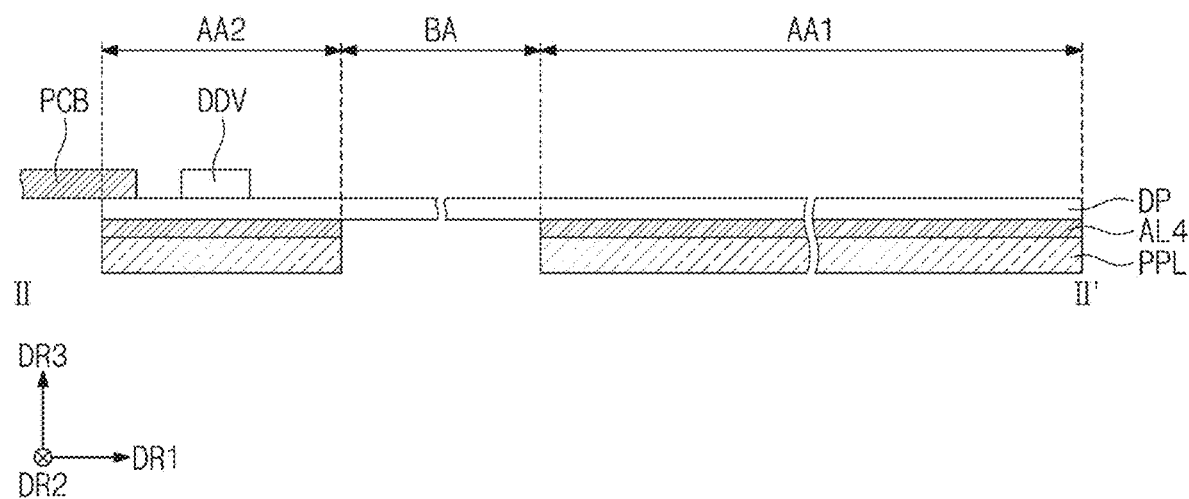
FIG. 9 is a cross-sectional view taken along line II-II' shown in FIG. 7.
Figure 10:
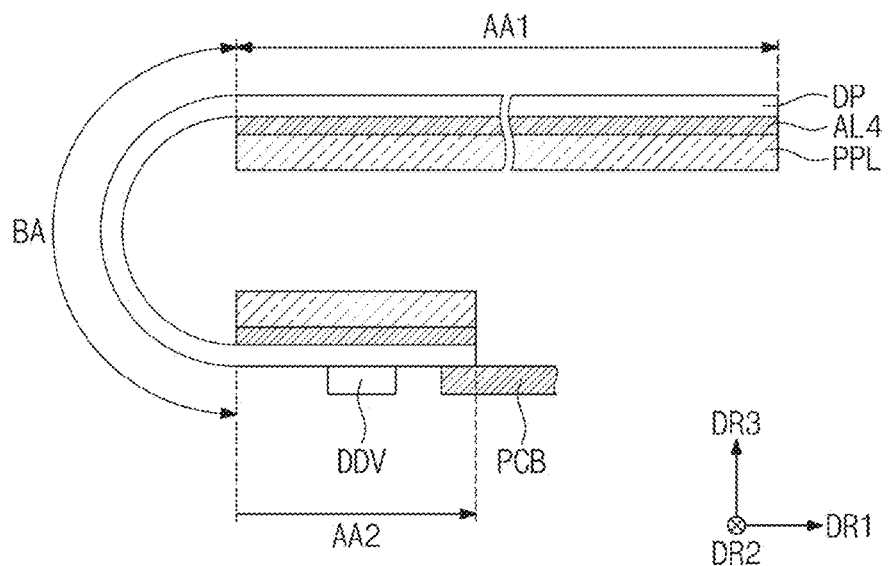
FIG. 10 is a view showing a bending region shown in FIG. 9 in a bent state.

FIG. 9 is a cross-sectional view taken along line II-IP shown in FIG. 7. FIG. 10 is a view showing a bending region shown in FIG. 9 in a bent state.

Referring to FIGS. 9 and 10, in an embodiment, the panel protection layer PPL and the adhesive layer AL4 may not be disposed below the bending region BA. The panel protection layer PPL and the adhesive layer AL4 may be disposed below the first region AA1 and the second region AA2 of the display panel DP. The data driver DDV may be disposed on the second region AA2 of the display panel DP.

A printed circuit board PCB may be connected to one side of the display panel DP. The printed circuit board PCB may be connected to the second region AA2. The printed circuit board PCB may be connected to one side of the second region AA2. The timing controller described above may be disposed on the printed circuit board PCB.

The bending region BA may be bent in a way such that the second region AA2 may be disposed below the first region AA1. Accordingly, the data driver DDV and the printed circuit board PCB may be disposed below the first region AA1 and may thus not be viewed from the outside.

The window protection layer WP, the window WIN, the shock absorbing layer ISL, the barrier layer BRL, and the support plate PLT shown in FIG. may be disposed to overlap the first region AA1, and may not overlap the bending region BA and the second region AA2. Although not shown, when the bending region BA is bent and the second region AA2 is disposed below the first region AA1, the second region AA2 may be disposed below the support plate PLT.

Figure 11:
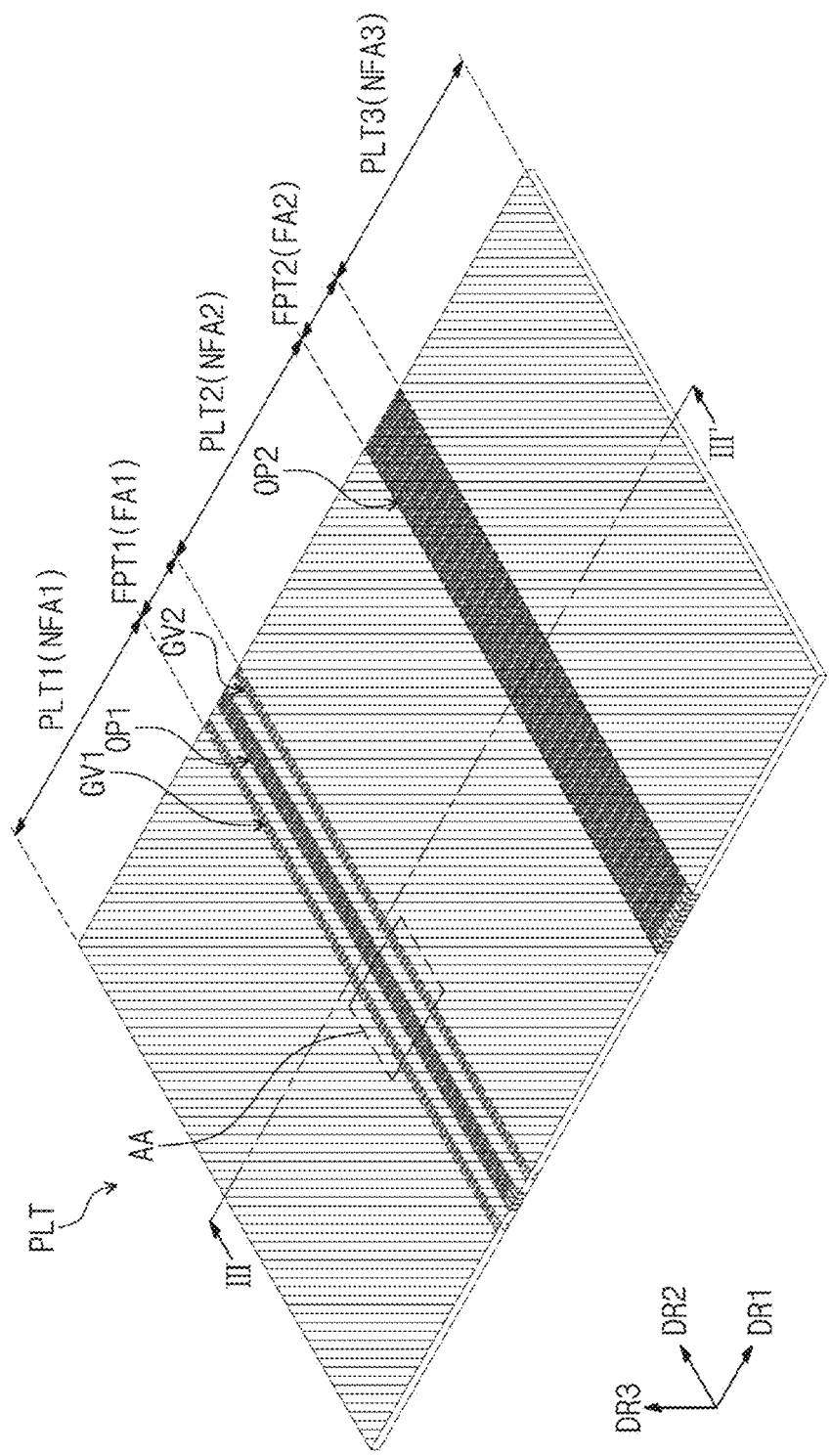
FIG. 11 is a perspective view of a support plate shown in FIG. 5.

FIG. 11 is a perspective view of a support plate shown in FIG. 5.

Referring to FIG. 11, the support plate PLT may include a first support plate PLT1, a first folding plate FPT1, a second support plate PLT2, a second folding plate FPT2, and a third support plate PLT3, which are arranged in the first direction DR1.

The second support plate PLT2 may be disposed between the first support plate PLT1 and the third support plate PLT3. The first folding plate FPT1 may be disposed between the first support plate PLT1 and the second support plate PLT2. The second folding plate FPT2 may be disposed between the second support plate PLT2 and the third support plate PLT3.

The first support plate PLT1 may overlap the first non-folding region NFA1 (shown in FIG. 1), and the second support plate PLT2 may overlap the second non-folding region NFA2 (shown in FIG. 1), and the third support plate PLT3 may overlap the third non-folding region NFA3 (shown in FIG. 1). The first folding plate FPT1 may overlap the first folding region FA1 (shown in FIG. 1), and the second folding plate FPT2 may overlap the second folding region FA2 (shown in FIG. 1).

A grid pattern may be defined on the first folding plate FPT1 and the second folding plate FPT2. In an embodiment, for example, a plurality of first openings OP1 and a plurality of grooves GV1 and GV2, which are arranged in a grid shape, may be defined in the first folding plate FPT1. A plurality of second openings OP2 arranged in a grid shape may be defined in the second folding plate FPT2.

The grooves GV1 and GV2 may be defined on a rear surface of the first folding plate FPT1, and such a configuration will be described in detail with reference to FIG. 13. For example, in FIG. 11, the grooves GV1 and GV2 defined on the rear surface of the first folding plate FPT1 are shown in dotted line.

As the first openings OP1 and the grooves GV1 and GV2 are defined in the first folding plate FPT1, an area of the first folding plate FPT1 may be reduced to reduce a stiffness of the first folding plate FPT1. Accordingly, the first folding plate FPT1 may have greater flexibility in an embodiment where the first openings OP1 and the grooves GV1 and GV2 are defined in the first folding plate FPT1 than in a case where the first openings OP1 and the grooves GV1 and GV2 are not defined. As a result, the first folding plate FPT1 may be folded more easily.

As the second openings OP2 are defined in the second folding plate FPT2, an area of the second folding plate FPT2 may be reduced to reduce a stiffness of the second folding plate FPT2. Accordingly, the second folding plate FPT2 may have greater flexibility in an embodiment where the second openings OP2 are defined in the first folding plate FPT2 than a case where the second openings OP2 are not defined. As a result, the second folding plate FPT2 may be folded more easily.

Figure 12:
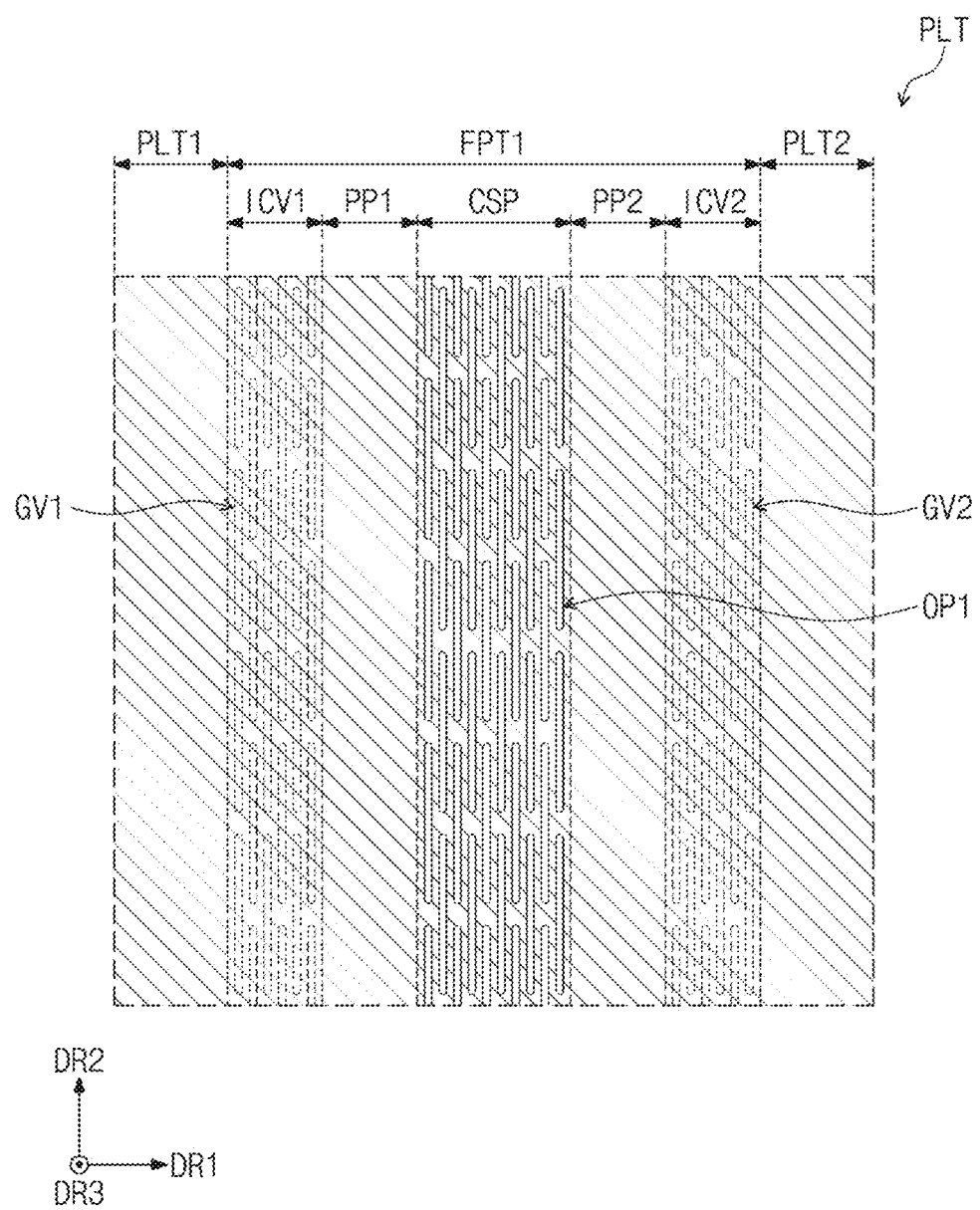
FIG. 12 is an enlarged plan view of region AA shown in FIG. 11.

FIG. 12 is an enlarged plan view of region AA shown in FIG. 11.

Referring to FIG. 12, the first folding plate FPT1 may include a first reverse curvature portion ICV1, a first flat portion PP1, a curved portion CSP, a second flat portion PP2, and a second reverse curvature portion CV2, which are arranged in the first direction DR1.

The curved portion CSP may be disposed between the first reverse curvature portion ICV1 and the second reverse curvature portion ICV2. The first flat portion PP1 may be disposed between the curved portion CSP and the first reverse curvature portion ICV1. The second flat portion PP2 may be disposed between the curved portion CSP and the second reverse curvature portion ICV2. The first reverse curvature portion ICV1 may be disposed between the curved portion CSP and the first support plate PLT1. The second reverse curvature portion ICV2 may be disposed between the curved portion CSP and the second support plate PLT2.

In an embodiment, for example, the curved portion CSP may be disposed at the center of the first folding plate FPT1. The first reverse curvature portion ICV1 may be defined as a portion of the first folding plate FPT1 adjacent to the first support plate PLT1. The second reverse curvature portion ICV2 may be defined as a portion of the first folding plate FPT1 adjacent to the second support plate PLT2.

The first openings OP1 may be defined in the curved portion CSP. The first openings OP1 may be arranged in the first direction DR1 and the second direction DR2. The first openings OP1 may extend further in the second direction DR2 than in the first direction DR1. The first openings OP1 may extend in a direction parallel to the first folding axis FX1 described above.

The first direction DR1 may correspond to a row direction, and the second direction DR2 may correspond to a column direction. The first openings OP1 disposed in an h-th column may be staggered with the first openings OP1 disposed in an (h+1)-th column. Here, h is a natural number. Although not shown in an enlarged view, the second openings OP2 may be arranged in a same shape as the first openings OP1.

The grooves GV1 and GV2 may be defined in the first reverse curvature portion ICV1 and the second reverse curvature portion ICV2. The grooves GV1 and GV2 may be defined on a rear surface of each of the first and second reverse curvature portions ICV1 and ICV2. In a cross-section, the grooves GV1 and GV2 defined on the rear surface of each of the first and second reverse curvature portions ICV1 and ICV2 are shown in FIG. 13.

Similar to the first openings OP1, the grooves GV1 and GV2 may be arranged in the first direction DR1 and the second direction DR2. The grooves GV1 and GV2 may extend further in the second direction DR2 than in the first direction DR1.

The grooves GV1 and GV2 may include a plurality of first grooves GV1 defined in the first reverse curvature portion ICV1, and a plurality of second grooves GV2 defined in the second reverse curvature portion ICV2. The first reverse curvature portion ICV1 and the second reverse curvature portion ICV2 may have different stiffnesses from each other due to the first grooves GV1 and the second grooves GV2. This configuration will be described in detail later.

The first grooves GV1 disposed in the h-th column may be staggered with the first grooves GV1 disposed in the (h+1)-th column. The second grooves GV2 disposed in the h-th column may be staggered with the second grooves GV2 disposed in the (h+1)-th column.

Figure 13:
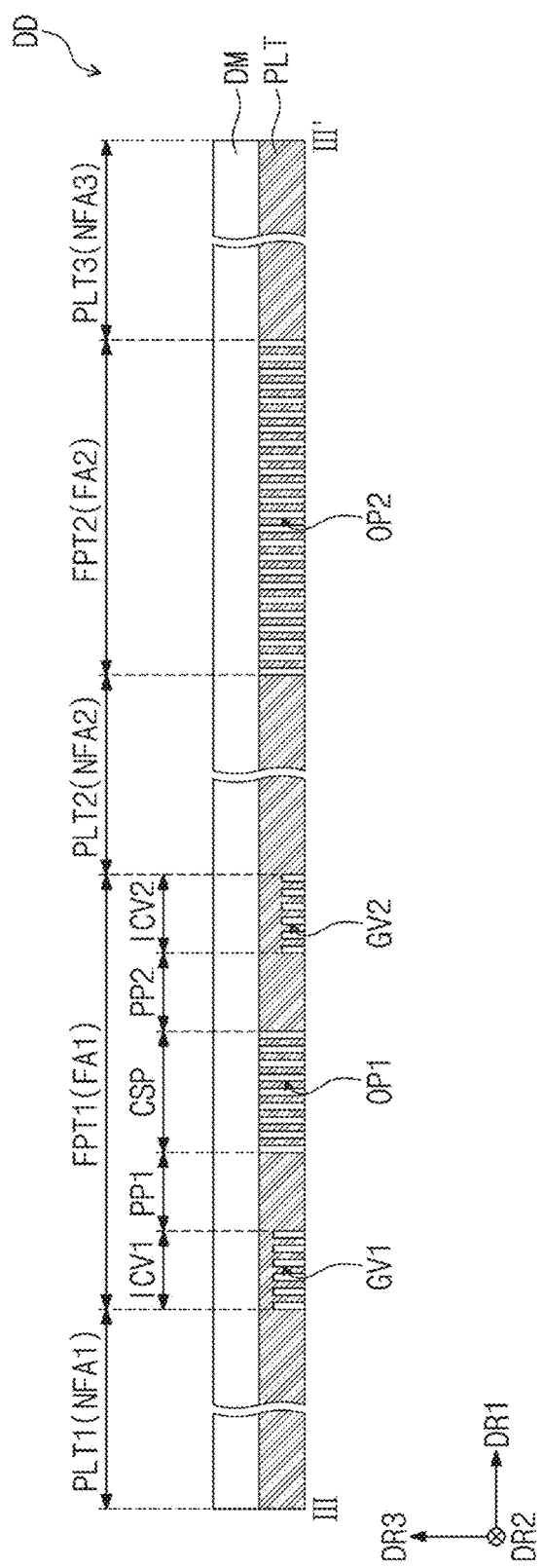
FIG. 13 is a cross-sectional view taken along line shown in FIG. 11.

FIG. 13 is a cross-sectional view taken along line shown in FIG. 11.

Particularly, in FIG. 13, the display module DM disposed on the support plate PLT is shown along with the support plate PLT. For convenience of description, detailed stacked components of the display module DM are omitted, and the display module DM is shown as a single layer.

Referring to FIG. 13, in an embodiment, the display module DM may be disposed on the support plate PLT. When viewed on a plane, the first, second, and third support plates PLT1, PLT2, and PLT3 may overlap the first, second, and third non-folding regions NFA1, NFA2, and NFA3 of the display module DM, respectively. When viewed on a plane, the first and second folding plates FPT1 and FPT2 may overlap the first and second folding regions FA1 and FA2 of the display module DM, respectively.

The first openings OP1 may be defined through portions of the curved portion CSP in the third direction DR3. The second openings OP2 may be defined through portions of the second folding plate FPT2 in the third direction DR3.

The first grooves GV1 may be defined on the rear surface of the first reverse curvature portion ICV1. The second grooves GV2 may be defined on the rear surface of the second reverse curvature portion ICV2. The rear surfaces of the first and second reverse curvature portions ICV1 and ICV2 may be defined as surfaces opposite to front surfaces of the first and second reverse curvature portions ICV1 and ICV2 facing the display module DM. The first openings OP1 and the first and second grooves GV1 and GV2 may not be defined in the first and second flat portions PP1 and PP2.

Figure 14:
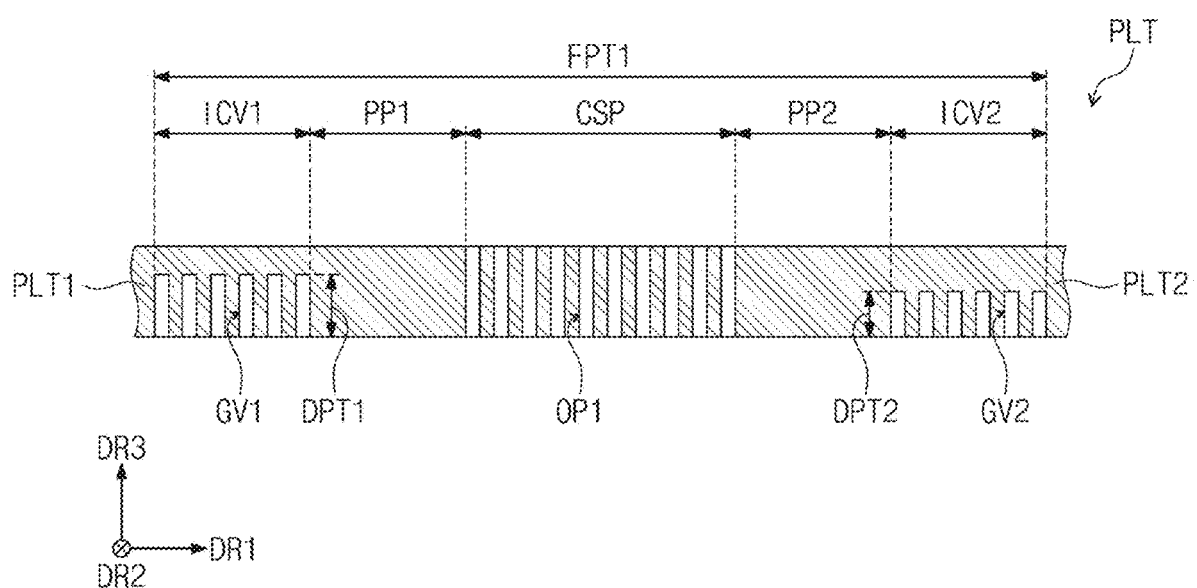
FIG. 14 is an enlarged view of a first folding plate shown in FIG. 13.

FIG. 14 is an enlarged view of a first folding plate shown in FIG. 13.

Referring to FIG. 14, the size of the first grooves GV1 and the size of the second grooves GV2 may be different from each other. The size of each of the first and second grooves GV1 and GV2 may be defined as an area of each of the first and second grooves GV1 and GV2 on a cross-section.

The stiffness of the first reverse curvature portion ICV1 and the stiffness of the second reverse curvature portion ICV2 may be defined according to the size of the first grooves GV1 and the size of the second grooves GV2. As the size of the first grooves GV1 and the size of the second grooves GV2 are different from each other, the stiffness of the first reverse curvature portion ICV1 and the stiffness of the second reverse curvature portion ICV2 may be different from each other. Stiffness may be defined as a level of bending. A more flexible component may have a lower stiffness, and a less flexible component may have a higher stiffness.

A depth of each of the first grooves GV1 may be different from a depth of each of the second grooves GV2 with respect to the third direction DR3 (e.g., a direction perpendicular to a rear surface of the first folding plate FPT1). In an embodiment, for example, each of the first grooves GV1 may have a first depth DPT1, and each of the second grooves GV2 may have a second depth DPT2 smaller than the first depth DPT1. That is, the depth of each of the first grooves GV1 may be greater than the depth of each of the second grooves GV2. In an embodiment, the first and second grooves GV1 and GV2 may have a same width as each other with respect to the first direction DR1.

In such an embodiment, on a cross-section, the first grooves GV1 may be larger than the second grooves GV2. According to the first grooves GV1 and the second grooves GV2, an area of the first reverse curvature portion ICV1 per unit length in the first direction DR1 may be smaller than an area of the second reverse curvature portion ICV2 per unit length in the first direction DR1 on a cross-section. Stiffness may be proportional to an area per unit length in the first direction DR1. Accordingly, the first reverse curvature portion ICV1 may be more flexible than the second reverse curvature portion ICV2, and the stiffness of the second reverse curvature portion ICV2 may be greater than the stiffness of the first reverse curvature portion ICV1.

Figure 15:
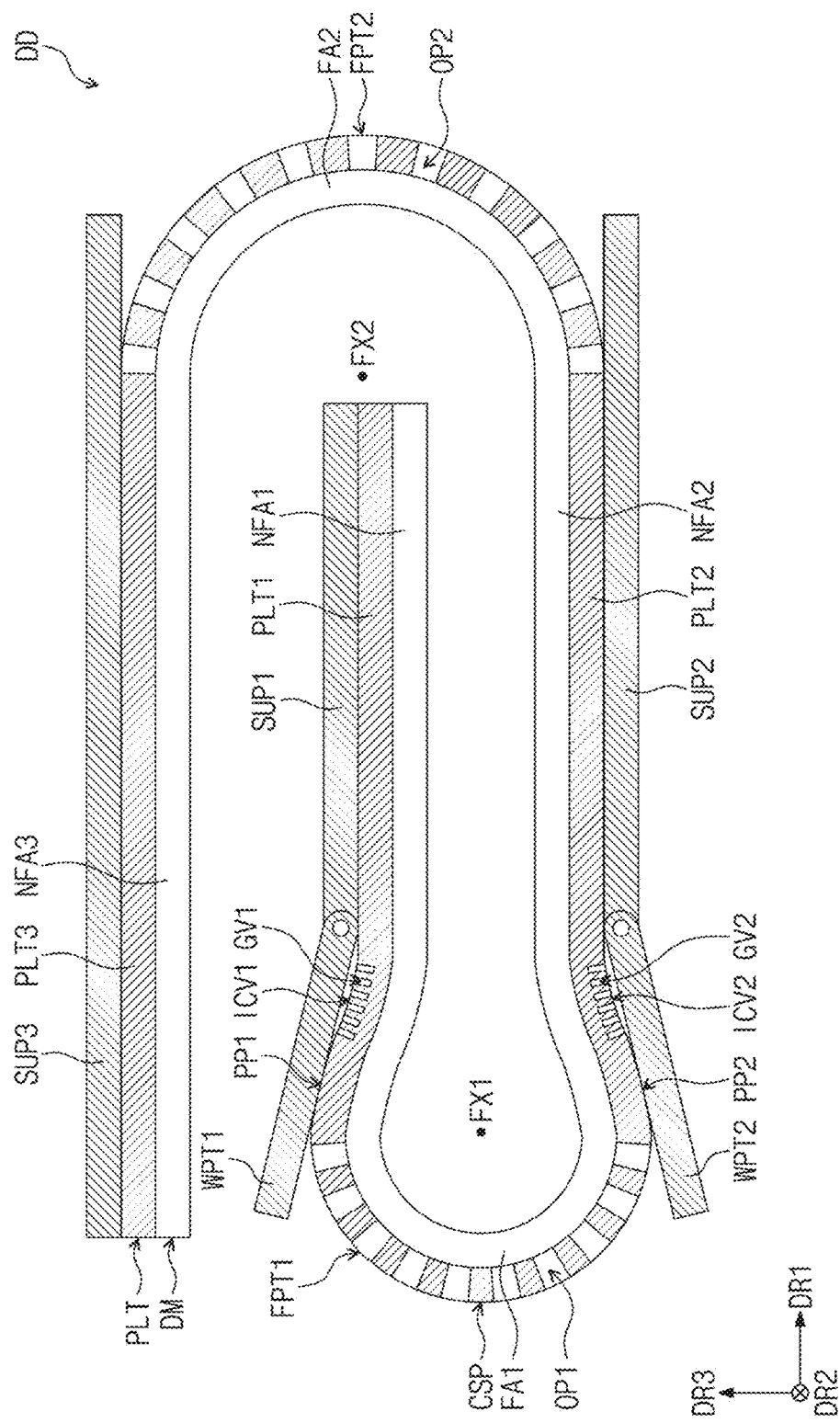
FIG. 15 is a view showing a support plate and a display module shown in FIG. 13 in a folded state.

FIG. 15 is a view showing a support plate and a display module shown in FIG. 13 in a folded state.

The folded state of the display device DD shown in FIG. 15 may correspond to the folded state of the display device DD shown in FIG. 2.

Referring to FIG. 15, the first folding plate FPT1 may be folded with respect to the first folding axis FX1. The first folding plate FPT1 may be folded in a way such that the first support plate PLT1 and the second support plate PLT2 are disposed to face each other.

The first folding region FA1 may be folded by the first folding plate FPT1 in a way such that the first non-folding region NFA1 and the second non-folding region NFA2 face each other. The first and second non-folding regions NFA1 and NFA2 may be disposed between the first and second support plates PLT1 and PLT2.

The first folding plate FPT1 may be folded in a dumbbell shape. The curved portion CSP may be bent to have a predetermined curvature. The curved portion CSP may be convexly bent outward. A rear surface of the curved portion CSP that does not face the display module DM may be convexly bent.

The first reverse curvature portion ICV1 and the second reverse curvature portion ICV2 may be bent opposite to the curved portion CSP. The first reverse curvature portion ICV1 and the second reverse curvature portion ICV2 may be concavely bent inward from each other. The rear surface of the first reverse curvature portion ICV1 and the rear surface of the second reverse curvature portion ICV2 that do not face the display module DM may be concavely bent. The first reverse curvature portion ICV1 and the second reverse curvature portion ICV2 may be formed to be mutually symmetrical.

The first flat portion PP1 may be relatively flatter than the first reverse curvature portion ICV1. The second flat portion PP2 may be relatively flatter than the second reverse curvature portion ICV2.

The second folding plate FPT2 may be folded with respect to the second folding axis FX2. The second folding plate FPT2 may be folded in a "U-like" shape. That is, the first folding plate PLT1 and the second folding plate FPT2 may be folded in different shapes.

The second folding plate FPT2 may be folded in a way such that the third support plate PLT3 is disposed on the first support plate PLT1. The third support plate PLT3 may face the first support plate PLT1. Accordingly, the first support plate PLT1 may be disposed between the second support plate PLT2 and the third support plate PLT3.

The second folding region FA2 may be folded by the second folding plate FPT2 in a way such that the third non-folding region NFA3 is disposed on the first non-folding region NFA1. The first non-folding region NFA1 may be disposed between the second non-folding region NFA2 and the third non-folding region NFA3. The third non-folding region NFA3 may be disposed between the first support plate PLT1 and the third support plate PLT3.

Based on the above structure, the first folding plate FPT1 and the first and second support plates PLT1 and PLT2 may be in-folded. In addition, the second folding plate FPT2 and the second and third support plates PLT2 and PLT3 may be in-folded.

The display device DD may further include first, second, and third support portions SUP1, SUP2, and SUP3 disposed on a rear surface of the support plate PLT opposite to the front surface of the support plate PLT facing the display module DM, and the first and second wing support portions WPT1 and WPT2.

The first support portion SUP1 may be disposed on the rear surface of the first support plate PLT1. The first wing support portion WPT1 may be bonded for rotation or rotatably connected to the first support portion SUP1 to be disposed on the rear surface of the first flat portion PP1.

The second support portion SUP2 may be disposed on the rear surface of the second support plate PLT2. The second wing support portion WPT2 may be bonded for rotation or rotatably connected to the second support portion SUP2 to be disposed on the rear surface of the second flat portion PP2. The third support portion SUP3 may be disposed on the rear surface of the third support plate PLT3.

The folded state of the support plate PLT is easily maintained by the first, second, and third support portions SUP1, SUP2, SUP3 and the first and second wing support portions WPT1 and WPT2, and the display module DM may be easily folded by the support plate PLT.

Figure 16A:
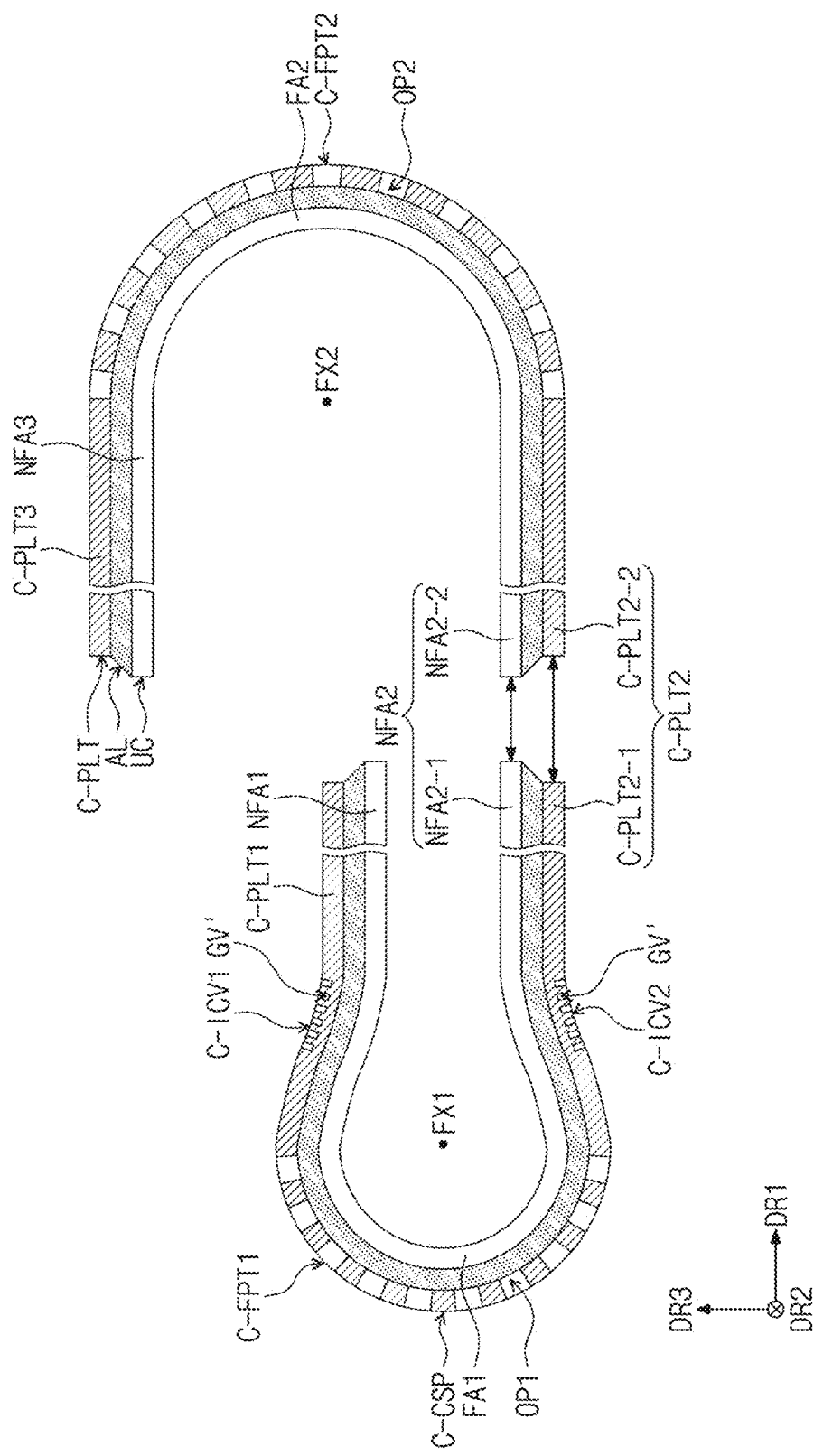

FIGS. 16A and 16B are views showing a support plate of a display device according to Comparative Example.

Hereinafter, a support plate C-PLT shown in FIGS. 16A and 16B is referred to as a comparative support plate C-PLT.

FIGS. 16A and 16B show an example in cross-sections corresponding to FIG. 15. In FIG. 16A, the second non-folding region NPA2 is divided into two including a first second non-folding region (hereinafter, will be referred to as "2-1 non-folding region") NPA2-1 and a second second non-folding region (hereinafter, will be referred to as "2-2 non-folding region") NPA2-2. In addition, in FIG. 16A, the second support plate C-PLT2 is divided into two including a first second support plate (hereinafter, will be referred to as "2-1 support plate") C-PLT2-1 and a second second support late (hereinafter, will be referred to as "2-2 support plate") C-PLT2-2.

The folded state of the comparative support plate C-PLT shown in FIGS. 16A and 16B may correspond to the folded state of the support plate PLT shown in FIG. 15.

Referring to FIG. 16A, an upper structure UC may be disposed on a front surface of the comparative support plate C-PLT. An adhesive layer AL may be disposed between the comparative support plate C-PLT and the upper structure UC. The upper structure may be any one among a window WIN, a window protection layer WP, a shock absorbing layer ISL, a display panel DP, a panel protection layer PPL, and a barrier layer BRL shown in FIG. 5. The adhesive layer AL may be any one among the first to sixth adhesive layers AL1 to AL6 shown in FIG. 5 corresponding to the upper structure.

The 2-1 support plate C-PLT2-1 may extend from a first folding plate C-FPT1. The 2-2 support plate C-PLT2-2 may extend from a second folding plate C-FPT2. An end of the 2-1 support plate C-PLT2-1 and an end of the 2-2 support plate C-PLT2-2 may face each other.

The 2-1 non-folding region NPA2-1 may extend from the first folding region FA1, and the 2-2 non-folding region NPA2-2 may extend from the second folding region FA2. An end of the 2-1 non-folding region NPA2-1 and an end of the 2-2 non-folding region NPA2-2 may face each other.

The first and second openings OP1 and OP2 and grooves GV' may be defined in the comparative support plate C-PLT. The first openings OP1 may be defined in a curved portion C-CSP, and the second openings OP2 may be defined in the second folding plate C-FPT2. The grooves GV' may be defined in first and second reverse curvature portions C-ICV1 and C-ICV2.

Unlike the structure shown in FIG. 14, grooves GV' having a same size may be defined in the first and second reverse curvature portions C-ICV1 and C-ICV2. Accordingly, the first reverse curvature portion C-ICV1 and the second reverse curvature portion C-ICV2 may have a same stiffness as each other.

The first and second folding plates C-FPT1 and C-FPT2 may be folded in a way such that the display module DM and the comparative support plate C-PLT are folded. The first folding plate C-FPT1 may be folded in a dumbbell shape, and the second folding plate C-FPT2 may be folded in a "U-like" shape.

A radius of curvature of the first and second folding plates FPT1 and FPT2 may be greater than a radius of curvature of the first and second folding regions FA1 and FA2. The adhesive layer AL may have fluidity. When the adhesive layer AL has fluidity, the comparative support plate C-PLT may slip with respect to the display module DM.

When the comparative support plate C-PLT slips with respect to the display module DM, the end of the first non-folding region NFA1 and the end of the 2-1 non-folding region NFA2-1 may protrude outward further than the end of the first support plate C-PLT1 and the end of the 2-1 support plate C-PLT2-1. In addition, an end of the third non-folding region NFA3 and the end of the 2-2 non-folding region NFA2-2 may protrude outward further than an end of the third support plate C-PLT3 and the end of the 2-2 support plate C-PLT2-2.

The distance between the end of the 2-1 support plate C-PLT2-1 and the end of the 2-2 support plate C-PLT2-2 may be greater than the distance between the end of the 2-1 non-folding region NFA2-1 and the end of the 2-2 non-folding region NFA2-2.

Referring to FIGS. 16A and 16B, substantially, the 2-1 support plate C-PLT2-1 and the 2-2 support plate (C-PLT2-2) may be bonded or integrally formed as a singly body to form the second support plate PLT2. Substantially, the 2-1 non-folding region NPA2-1 and the 2-2 non-folding region NPA2-2 may be bonded or integrally formed as a singly body to form the second non-folding region NFA2.

Since the 2-1 support plate C-PLT2-1 and the 2-2 support plate C-PLT2-2 are spaced apart further from each other than the 2-1 non-folding region NFA2-1 and the 2-2 non-folding region NFA2-2 are in the folded state, the 2-1 support plate C-PLT2-1 and the 2-2 support plate C-PLT2 may be pulled further from each other than the 2-1 non-folding region NFA2-1 and the 2-2 non-folding region NFA2-2.

In this case, the first folding plate C-PLT1 having a dumbbell shape may sag. Accordingly, the first reverse curvature portion C-ICV1 and the second reverse curvature portion C-ICV2 may not be mutually symmetrical. That is, the dumbbell shape of the first folding plate C-PLT1 may be deformed.

Referring to FIG. 15, in an embodiment of the invention, the second reverse curvature portion ICV2 may have a greater stiffness than the first reverse curvature portion ICV1. The second reverse curvature portion ICV2 may have a property of being less bent than the first reverse curvature portion ICV1. Accordingly, when the dumbbell shape is about to sag as shown in FIG. 16B, the second reverse curvature portion ICV2 which has greater stiffness and may be less bent than in FIG. 15 may prevent the dumbbell shape from sagging. As a result, the dumbbell shape of the first folding plate FPT1 may be effectively prevented from being deformed and may be maintained to be more symmetrical.

Figure 17:
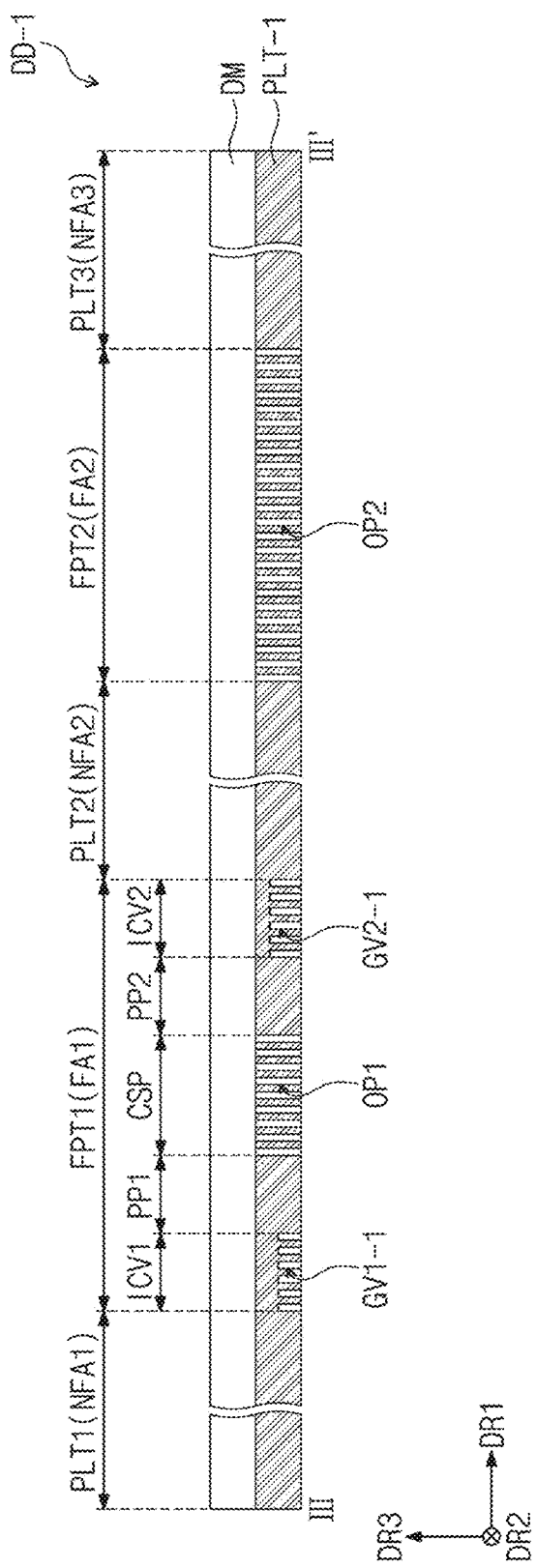
FIG. 17 is a view showing a cross-section of a support plate and a display module in the display device shown in FIG. 3.
Figure 18:
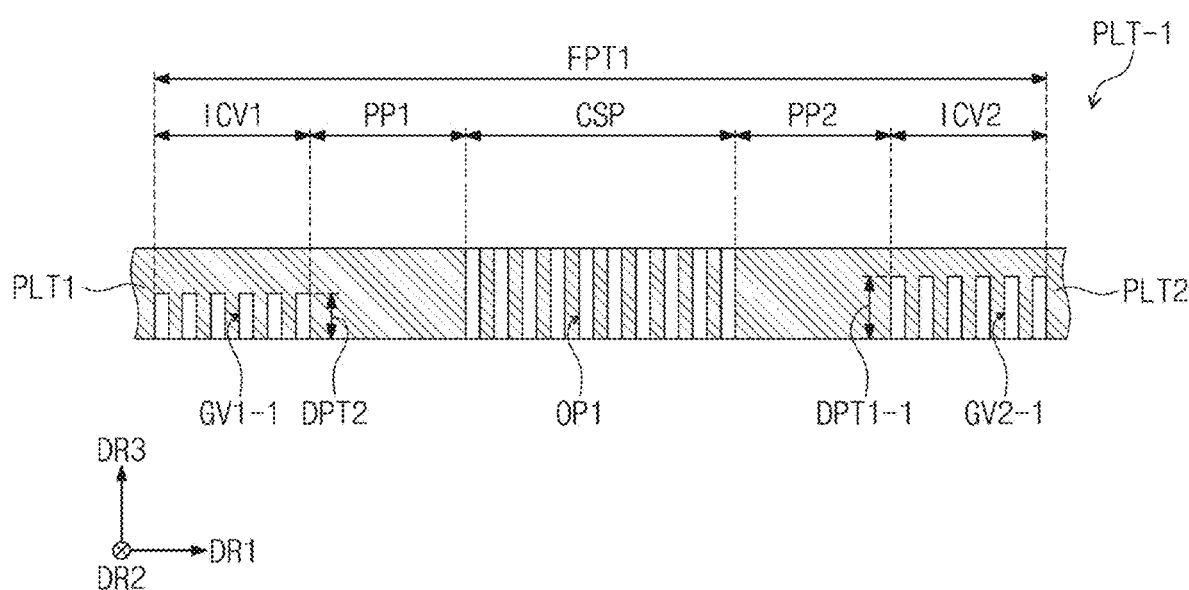
FIG. 18 is an enlarged view of a first folding plate shown in FIG. 17.

FIG. 17 is a view showing a cross-section of a support plate and a display module of the display device shown in FIG. 3. FIG. 18 is an enlarged view of a first folding plate shown in FIG. 17.

By way of example, FIG. 17 is shown as a cross-section corresponding to FIG. 13. Hereinafter, components of the support plate PLT-1 shown in FIG. 17 will be described mainly on components different from the components of the support plate PLT shown in FIG. 13. Substantially, since the structure of the grooves GV1-1 and GV2-1 are different from the structure of the grooves GV1 and GV2 shown in FIG. 13, symbols of the grooves GV1-1 and GV2-1 are shown to be different from those of FIG. 13, and other symbols are shown to be the same as those of FIG. 13.

Referring to FIGS. 17 and 18, first grooves GV1-1 may be defined on the rear surface of the first reverse curvature portion ICV1. The second grooves GV2-1 may be defined on the rear surface of the second reverse curvature portion ICV2. The size of the first grooves GV1-1 and the size of the second grooves GV2-1 may be different from each other. As the size of the first grooves GV1-1 and the size of the second grooves GV2-1 are different from each other, the stiffness of the first reverse curvature portion ICV1 and the stiffness of the second reverse curvature portion ICV2 may be different from each other.

With respect to the third direction DR3, each of the first grooves GV1-1 may have a second depth DPT2, and each of the second grooves GV2-1 may have a first depth DPT1 smaller than the second depth DPT2. That is, the depth of each of the second grooves GV2-1 may be greater than the depth of each of the first grooves GV1-1. The first and second grooves GV1-1 and GV2-1 may have the same width with respect to the first direction DR1.

In such an embodiment, on a cross-section, the second grooves GV2 may be larger than the first grooves GV1. According to the first grooves GV1 and the second grooves GV2, an area of the second reverse curvature portion ICV2 may be smaller than an area of the first reverse curvature portion ICV1 on a cross-section. Accordingly, the second reverse curvature portion ICV2 may be more flexible than the first reverse curvature portion ICV1, and the stiffness of the first reverse curvature portion ICV1 may be greater than the stiffness of the second reverse curvature portion ICV2.

Figure 19:
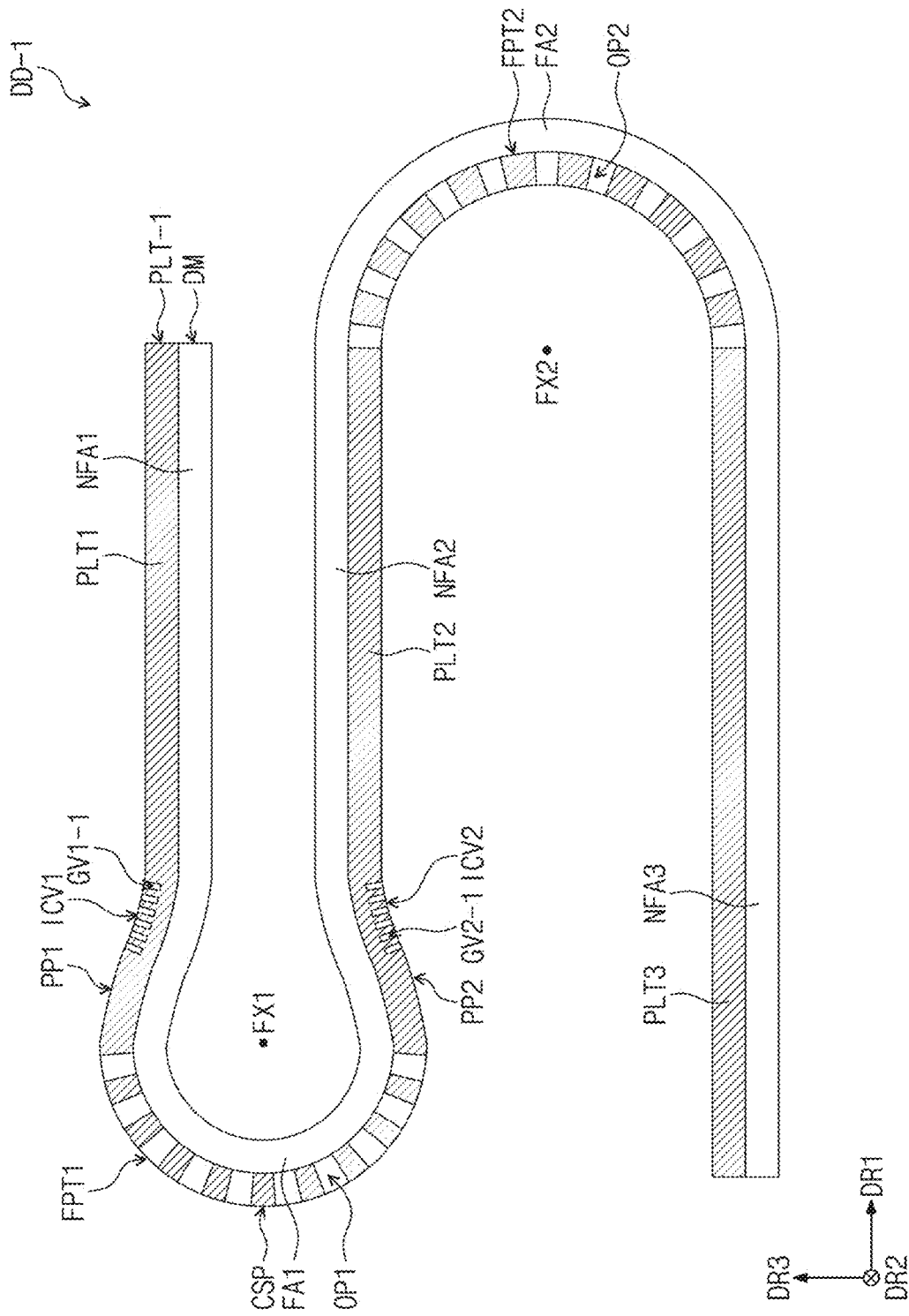
FIG. 19 is a view showing a support plate and a display module shown in FIG. 17 in a folded state.

FIG. 19 is a view showing a support plate and a display module shown in FIG. 17 in a folded state.

The folded state of a display device DD-1 shown in FIG. 19 may correspond to the folded state of a display device DD-1 shown in FIG. 3.

Referring to FIG. 19, the first folding plate FPT1 may be folded in a way such that the first support plate PLT1 and the second support plate PLT2 are disposed to face each other. The first folding region FA1 may be folded by the first folding plate FPT1 in a way such that the first non-folding region NFA1 and the second non-folding region NFA2 face each other.

The first folding plate FPT1 may be folded in a dumbbell shape. The curved portion CSP may be bent to have a predetermined curvature. The first reverse curvature portion ICV1 and the second reverse curvature portion ICV2 may be bent opposite to the curved portion CSP.

The second folding plate FPT2 may be folded in a "U-like" shape. The second folding plate FPT2 may be folded such that the third support plate PLT3 is disposed below the second support plate PLT2. The third support plate PLT3 may face the second support plate PLT2. Accordingly, the second support plate PLT2 may be disposed between the first support plate PLT1 and the third support plate PLT3.

The second folding region FA2 may be folded by the second folding plate FPT2 in a way such that the third non-folding region NFA3 is disposed below the second non-folding region NFA2. The second non-folding region NFA2 may be disposed between the first non-folding region NFA1 and the third non-folding region NFA3.

In such an embodiment, the first folding plate FPT1 and the first and second support plates PLT1 and PLT2 may be in-folded. In addition, the second folding plate FPT2 and the second and third support plates PLT2 and PLT3 may be out-folded.

The first, second, and third support portions SUP1, SUP2, and SUP3 and the first and second wing support portions WPT1 and WPT2 shown in FIG. 15 are omitted in FIG. 19 for convenience of illustration.

Figure 20A:
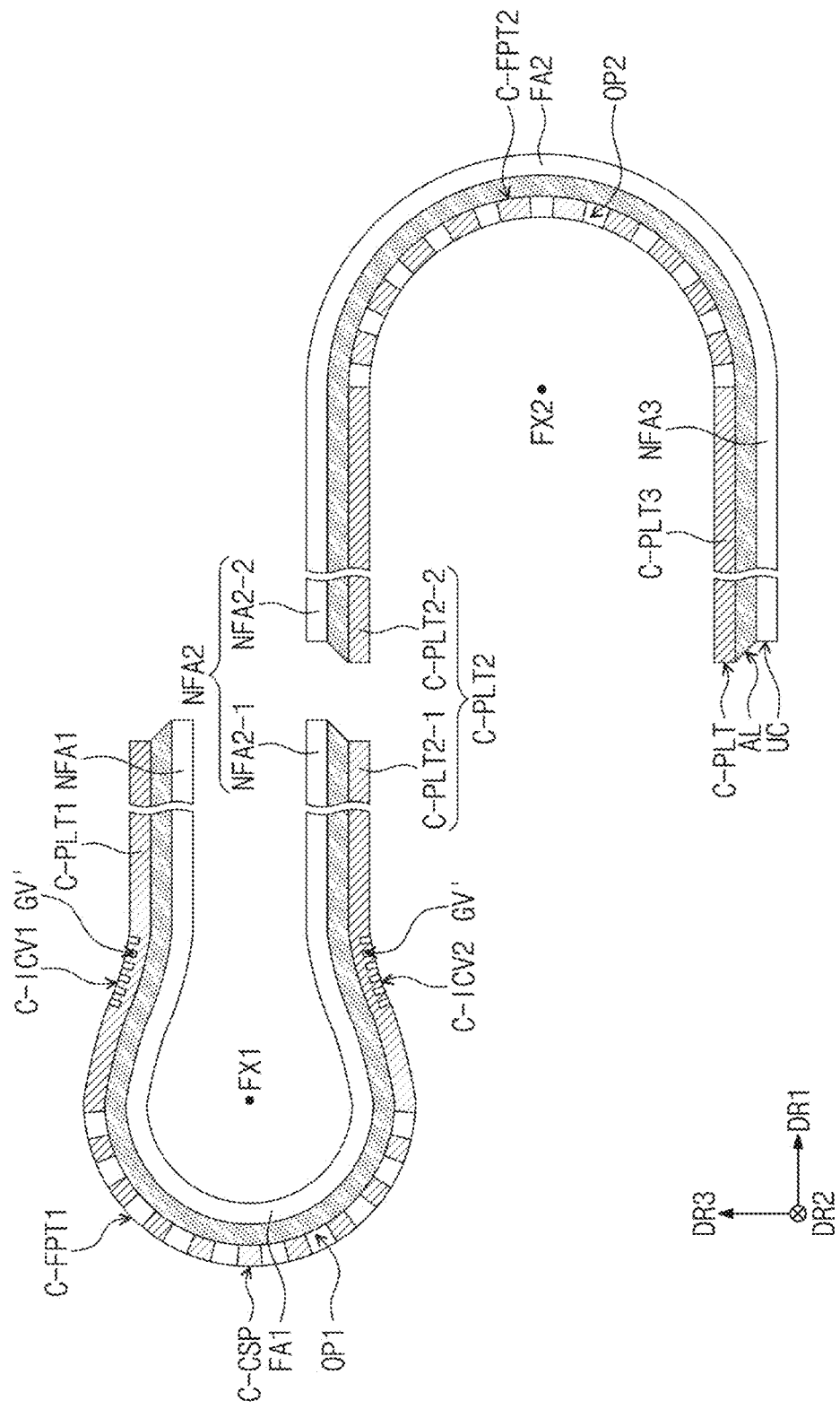

FIGS. 20A and 20B are views showing a support plate of a display device according to Comparative Example.

The comparative support plate C-PLT shown in FIGS. 20A and 20B may be substantially the same as the comparative support plate C-PLT shown in FIGS. 16A and 16B except for the folded state.

Similar to FIG. 16A, in FIG. 20A, the second non-folding region NPA2 is divided into two to include a first second non-folding region (hereinafter, will be referred to as "2-1 non-folding region") NPA2-1 and a second second non-folding region (hereinafter, will be referred to as "2-2 non-folding region") NPA2-2, and the second support plate C-PLT2 is divided into two including a first second support plate (hereinafter, will be referred to as "2-1 support plate") C-PLT2-1 and a second second support plate (hereinafter, will be referred to as "2-2 support plate") C-PLT2-2.

The folded state of the comparative support plate C-PLT shown in FIGS. 20A and 20B may correspond to the folded state of the support plate PLT-1 shown in FIG. 19.

Referring to FIG. 20A, an upper structure UC may be disposed on a front surface of the comparative support plate C-PLT. An adhesive layer AL may be disposed between the comparative support plate C-PLT and the upper structure UC. Grooves GV' having a same size as each other may be defined in the first and second reverse curvature portions C-ICV1 and C-ICV2 such that the first reverse curvature portion C-ICV1 and the second reverse curvature portion C-ICV2 have a same stiffness as each other.

An end of the 2-1 support plate C-PLT2-1 and an end of the 2-2 support plate C-PLT2-2 may face each other. An end of the 2-1 non-folding region NPA2-1 and an end of the 2-2 non-folding region NPA2-2 may face each other.

The first folding plate C-FPT1 may be folded in a dumbbell shape, and the second folding plate C-FPT2 may be folded in a "U-like" shape such that the comparative support plate C-PLT is folded. A radius of curvature of the first and second folding plates FPT1 and FPT2 may be greater than a radius of curvature of the first and second folding regions FA1 and FA2. By the adhesive layer AL having fluidity, the comparative support plate C-PLT may slip with respect to the display module DM.

An end of the first non-folding region NFA1 and the end of the 2-1 non-folding region NFA2-1 may protrude outward further than an end of the first support plate C-PLT1 and the end of the 2-1 support plate C-PLT2-1. An end of the third non-folding region NFA3 and the end of the 2-2 non-folding region NFA2-2 may protrude outward further than an end of the third support plate C-PLT3 and the end of the 2-2 support plate C-PLT2-2.

The distance between the end of the 2-1 support plate C-PLT2-1 and the end of the 2-2 support plate C-PLT2-2 may be about the same as the distance between the end of the 2-1 non-folding region NFA2-1 and the end of the 2-2 non-folding region NFA2-2.

Referring to FIGS. 20A and 20B, the 2-1 support plate C-PLT2-1 and the 2-2 support plate C-PLT2-2 may be bonded or integrally formed as a singly body to form the second support plate PLT2. The 2-1 non-folding region NPA2-1 and the 2-2 non-folding region NPA2-2 may be bonded or integrally formed as a singly body to form the second non-folding region NFA2.

When the distance between the end of the 2-1 support plate C-PLT2-1 and the end of the 2-2 support plate C-PLT2-2 is about the same as the distance between the end of the 2-1 non-folding region NFA2-1 and the end of the 2-2 non-folding region NFA2-2, the second support plate C-PLT2 may be likely stretched out flat.

In this case, the first folding plate C-PLT1 having a dumbbell shape may come off upward. Accordingly, the first reverse curvature portion C-ICV1 and the second reverse curvature portion C-ICV2 are not mutually symmetrical so that the dumbbell shape of the first folding plate C-PLT1 may be deformed.

Referring to FIG. 19, in an embodiment of the invention, the first reverse curvature portion ICV1 may have greater stiffness than the second reverse curvature portion ICV2. The second reverse curvature portion ICV2 may have a property of being more bent than the first reverse curvature portion ICV1. Accordingly, when the dumbbell shape is about to come off upward as shown in FIG. 20B, the second reverse curvature portion ICV2, which has a less stiffness and may be more bent than as shown in FIG. 19, may prevent the dumbbell shape from coming off. As a result, the dumbbell shape of the first folding plate FPT1 may be effectively prevented from being deformed and may be maintained to be more symmetrical.

FIGS. 21 to 26 are views showing components of support plates according to various embodiments of the invention.

Figure 24:
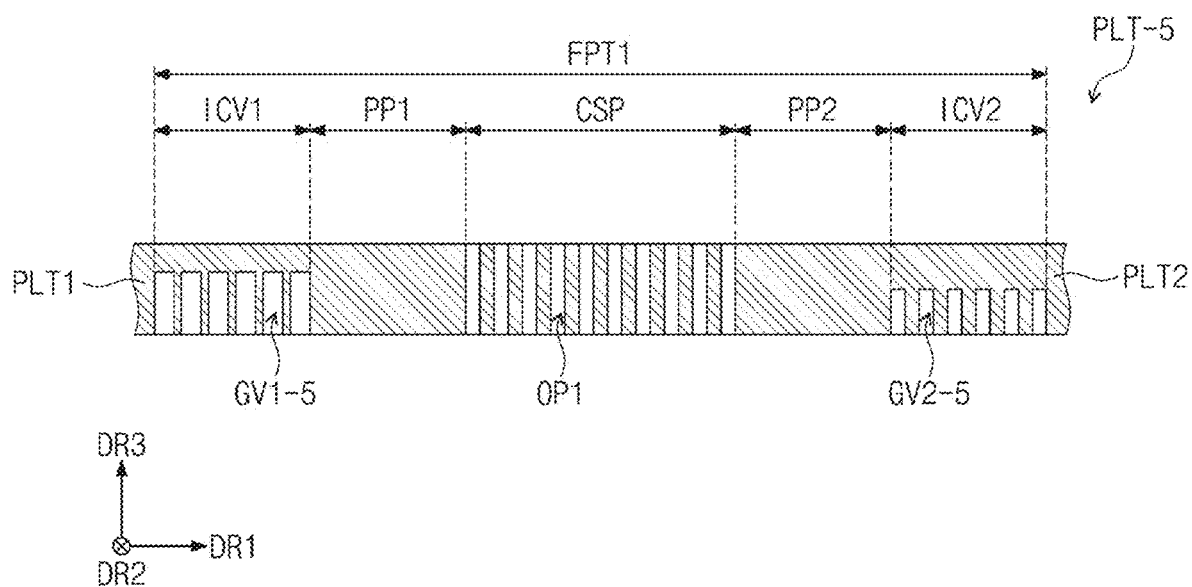
Figure 25:
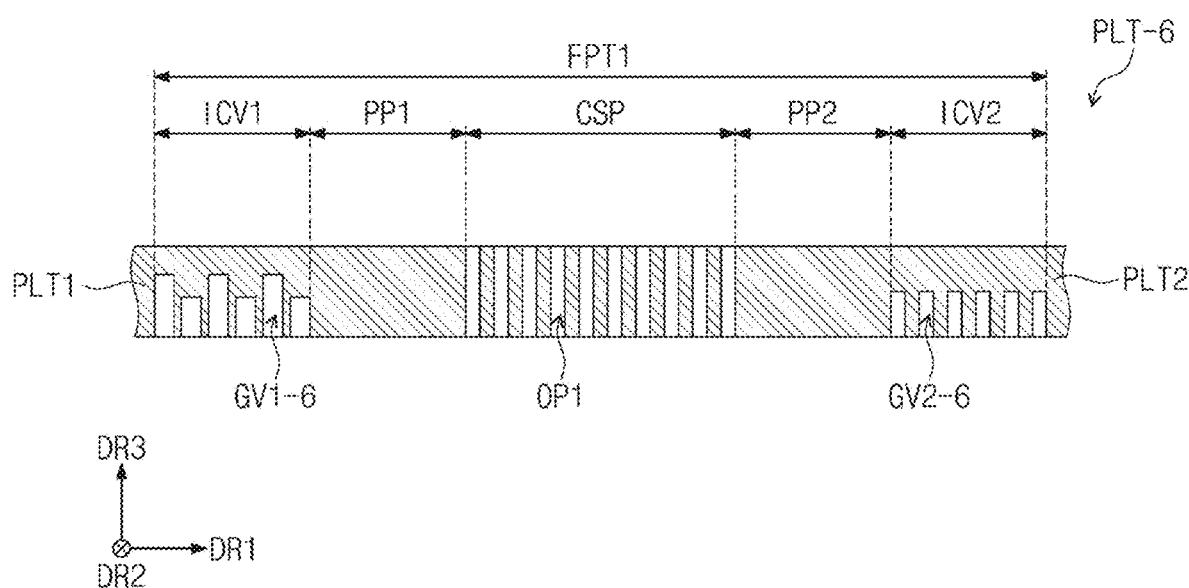
Figure 26:
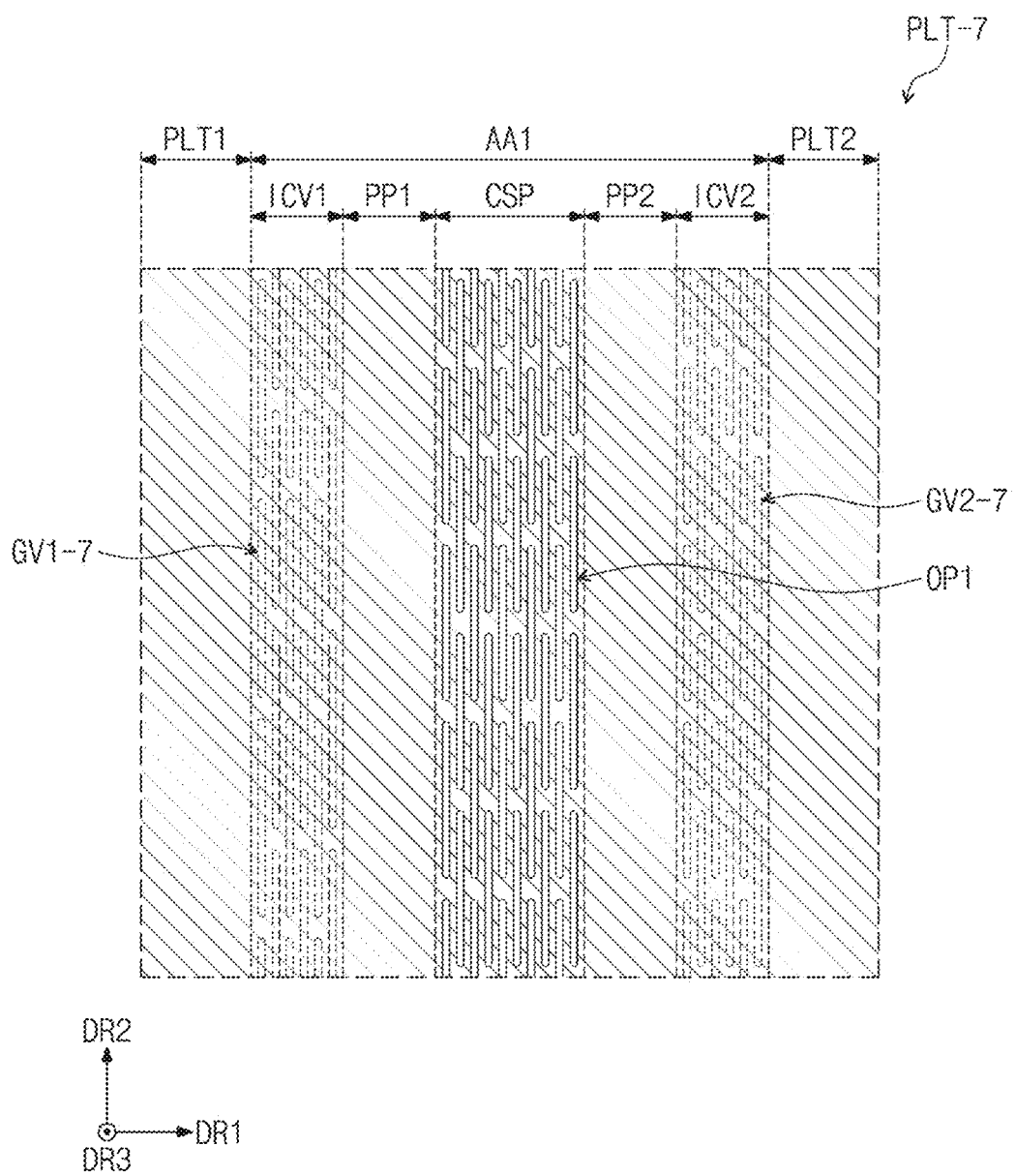

FIGS. 21 to 25 are shown in cross-sections corresponding to FIG. 14, and FIG. 26 show a plan view corresponding to FIG. 12 according to an embodiment of the invention.

The embodiments of the support plate PLT-2 to PLT-7 shown in FIGS. 21 to 26 may have substantially the same as the embodiment of the support plate PLT shown in FIG. 13 except for the shapes of the grooves GV1-2 to GV1-7, GV2-2, and GV2-7. Accordingly, hereinafter, the features of the grooves GV1-2 to GV1-7, GV2-2, and GV2-7 defined in the embodiments of the support plate PLT-2 to PLT-7 will be mainly described.

Figure 21:
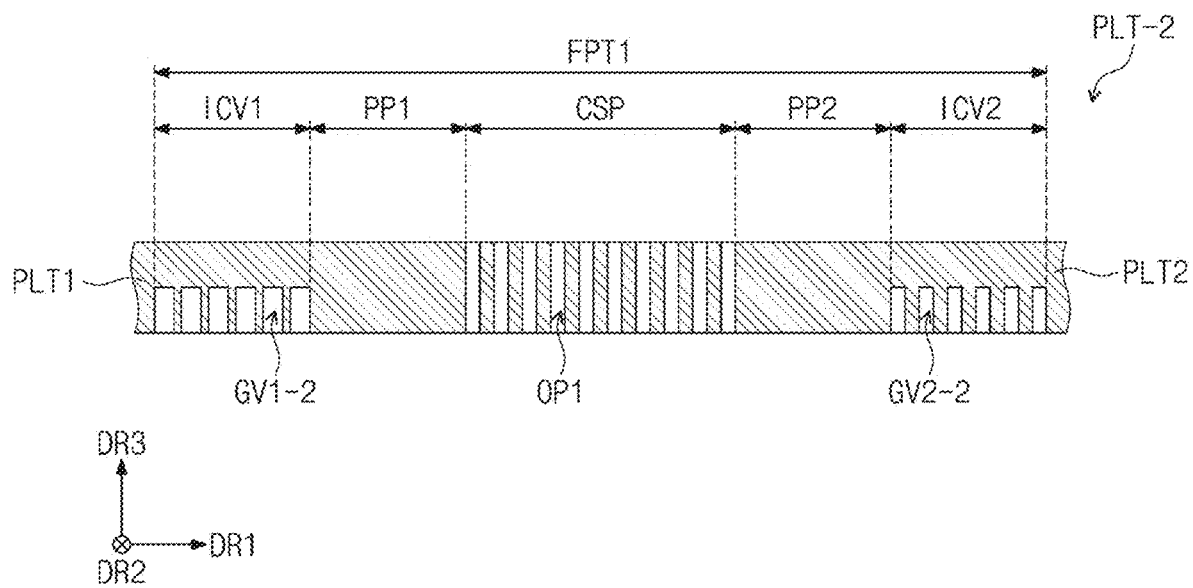
FIGS. 21 to 26 are views showing components of support plates according to various embodiments of the invention.

Referring to FIG. 21, in an embodiment, first grooves GV1-2 may be defined on the rear surface of the first reverse curvature portion ICV1 of the support plate PLT-2. Second grooves GV2-2 may be defined on a rear surface of the second reverse curvature portion ICV2 of the support plate PLT-2.

A width of each of the first grooves GV1-2 may be different from a width of each of the second grooves GV2-2 with respect to the first direction DR1. In an embodiment, for example, by varying the width of the first grooves GV1-2, the width of each of the first grooves GV1-2 may be greater than the width of each of the second grooves GV2-2 with respect to the first direction DR1. The first direction DR1 may be defined as a direction perpendicular to an extending direction (the second direction DR2) of the first and second grooves GV1-2 and GV2-2.

According to the first and second grooves GV1-2 and GV2-2, the stiffness of the first reverse curvature portion ICV1 may be smaller than the stiffness of the second reverse curvature portion ICV2.

Figure 22:
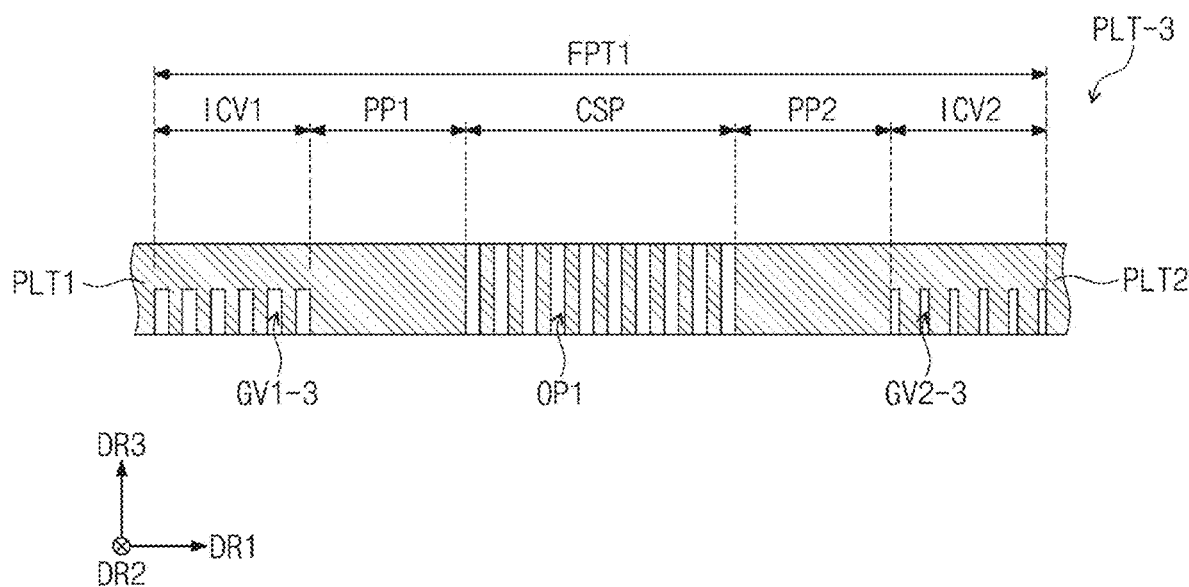

Referring to FIG. 22, in an alternative embodiment, first grooves GV1-3 may be defined on the rear surface of the first reverse curvature portion ICV1 of the support plate PLT-3, and second grooves GV2-3 may be defined on the rear surface of the second reverse curvature portion ICV2 of the support plate PLT-3.

A width of each of the first grooves GV1-3 may be different from a width of each of the second grooves GV2-3 with respect to the first direction DR1. In an embodiment, for example, by varying the width of the second grooves GV2-3, the width of each of the second grooves GV2-3 may be smaller than the width of each of the first grooves GV1-3 with respect to the first direction DR1.

According to the first and second grooves GV1-3 and GV2-3, the stiffness of the first reverse curvature portion ICV1 may be smaller than the stiffness of the second reverse curvature portion ICV2.

Figure 23:
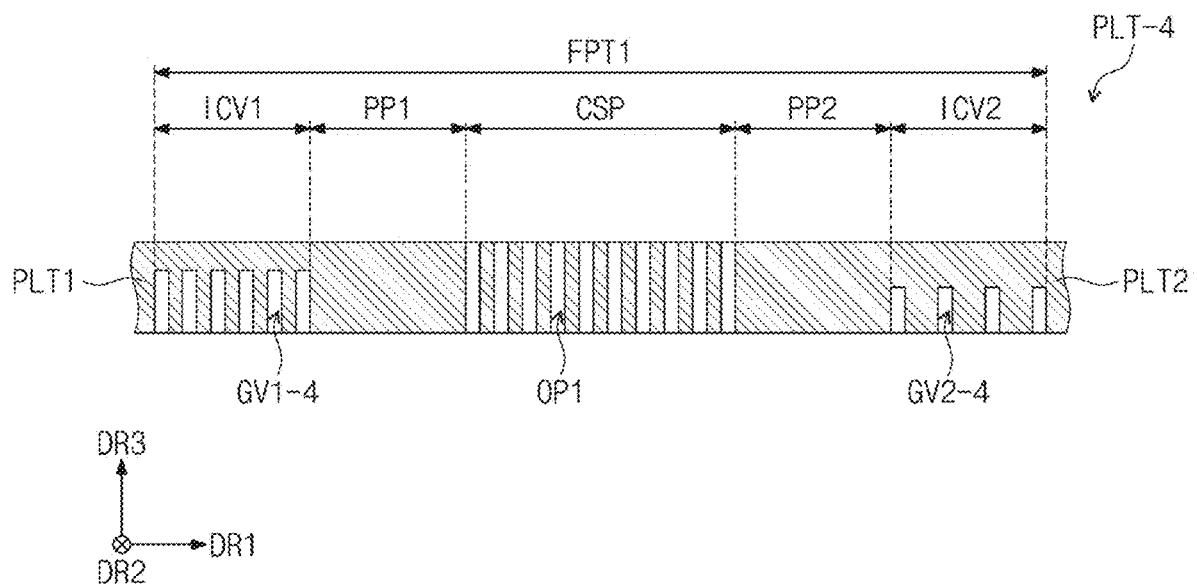

Referring to FIG. 23, in an alternative embodiment, first grooves GV1-4 may be defined on the rear surface of the first reverse curvature portion ICV1 of the support plate PLT-4, and second grooves GV2-4 may be defined on the rear surface of the second reverse curvature portion ICV2 of the support plate PLT-4.

The number of the first grooves GV1-4 per unit length in the first direction DR1 may be different from the number of the second grooves GV2-4 per unit length in the first direction DR1. In an embodiment, for example, the number of the first grooves GV1-4 per unit length in the first direction DR1 may be greater than the number of the second grooves GV2-4 per unit length in the first direction DR1. Accordingly, the stiffness of the first reverse curvature portion ICV1 may be smaller than the stiffness of the second reverse curvature portion ICV2 according to the first and second grooves GV1-4 and GV2-4.

Referring to FIG. 24, in an alternative embodiment, first grooves GV1-5 may be defined on the rear surface of the first reverse curvature portion ICV1 of the support plate PLT-5, and second grooves GV2-5 may be defined on the rear surface of the second reverse curvature portion ICV2 of the support plate PLT-5.

A width of each of the first grooves GV1-5 may be greater than a width of each of the second grooves GV2-5 with respect to the first direction DR1. A depth of each of the first grooves GV1-5 may be greater than a depth of each of the second grooves GV2-5 with respect to the third direction DR3. Accordingly, the stiffness of the first reverse curvature portion ICV1 may be smaller than the stiffness of the second reverse curvature portion ICV2 according to the first and second grooves GV1-5 and GV2-5.

Referring to FIG. 25, in an alternative embodiment, first grooves GV1-6 may be defined on the rear surface of the first reverse curvature portion ICV1 of the support plate PLT-6, and second grooves GV2-6 may be defined on the rear surface of the second reverse curvature portion ICV2 of the support plate PLT-6.

A width of each of the first grooves GV1-3 may be greater than a width of each of the second grooves GV2-6 with respect to the first direction DR1. A depth of each of some of the first grooves GV1-6 among the first grooves GV1-3 may be greater than a depth of each of the second grooves GV2-3 with respect to the third direction DR3. Accordingly, the stiffness of the first reverse curvature portion ICV1 may be smaller than the stiffness of the second reverse curvature portion ICV2 according to the first and second grooves GV1-6 and GV2-6.

Referring to FIG. 26, in an alternative embodiment, first grooves GV1-7 may be defined on the rear surface of the first reverse curvature portion ICV1 of the support plate PLT-7, and second grooves GV2-7 may be defined on the rear surface of the second reverse curvature portion ICV2 of the support plate PLT-7.

A length of each of the first grooves GV1-7 in the second direction DR2 may be different from a length of each of the second grooves GV2-7 in the second direction DR2. In an embodiment, for example, the length of each of the first grooves GV1-7 in the second direction DR2 may be greater than the length of each of the second grooves GV2-7 in the second direction DR2. Accordingly, the stiffness of the first reverse curvature portion ICV1 may be smaller than the stiffness of the second reverse curvature portion ICV2 according to the first and second grooves GV1-7 and GV2-7.

FIGS. 21 to 26 show embodiments in which stiffnesses of the first reverse curvature portions ICV1 are smaller than stiffnesses of the second reverse curvature portions ICV2. However, the embodiment of the invention is not limited thereto, and alternatively, in a case where the left and the right are reversed in the shapes of the first grooves GV1-2 to GV1-7 and the second grooves GV2-2 to GV2-7, stiffness of the first reverse curvature portions ICV1 may be greater than stiffness of the second reverse curvature portions ICV2.

According to embodiments of the invention, a first reverse curvature portion and a second reverse curvature portion of a first folding plate, which are folded in a dumbbell shape, have different stiffnesses from each other, and the dumbbell shape of the first folding plate may thus not be deformed and be maintained to be more symmetrical.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:
1. A display device comprising:
a display module; and
a support plate disposed below the display module and including a first support plate, a second support plate, and a first folding plate disposed between the first support plate and the second support plate,
wherein the first folding plate includes:
a curved portion;
a first reverse curvature portion disposed between the first support plate and the curved portion; and
a second reverse curvature portion disposed between the second support plate and the curved portion,
wherein the curved portion is convexly bent outward, and each of the first reverse curvature portion and the second reverse curvature portion is concavely bent inward when the first fold plate is folded, and
wherein a stiffness of the first reverse curvature portion is different from a stiffness of the second reverse curvature portion.

2. The display device of claim 1, wherein
a plurality of first openings is defined in the curved portion,
a plurality of first grooves is defined on a rear surface of the first reverse curvature portion, and
a plurality of second grooves is defined on a rear surface of the second reverse curvature portion.

3. The display device of claim 2, wherein a size of the first grooves and a size of the second grooves are different from each other.

4. The display device of claim 2, wherein a depth of each of the first grooves in a direction perpendicular with respect to a rear surface of the first folding plate is different from a depth of each of the second grooves in the direction perpendicular with respect to the rear surface of the first folding plate.

5. The display device of claim 2, wherein the support plate further comprises:
a third support plate; and
a second folding plate disposed between the second support plate and the third support plate, wherein a plurality of second openings is defined in the second folding plate, and
the first, second, and third support plates are arranged in a first direction, and
the first and second folding plates are foldable in different shapes with respect to folding axes extending in a second direction crossing the first direction.

6. The display device of claim 5, wherein
the first folding plate is foldable in a dumbbell shape,
the first and second reverse curvature portions are bent opposite to the curved portion when the first folding plate is folded in the dumbbell shape, and
the second folding plate is foldable in a U-like shape.

7. The display device of claim 5, wherein
when the first and second folding plates are folded, the first and second support plates face each other, and when the first and second folding plates are folded, the first support plate is disposed between the second support plate and the third support plate.

8. The display device of claim 7, wherein the stiffness of the second reverse curvature portion is greater than the stiffness of the first reverse curvature portion.

9. The display device of claim 7, wherein a depth of each of the first grooves in a direction perpendicular with respect to a rear surface of the first folding plate is greater than a depth of each of the second grooves in the direction perpendicular with respect to the rear surface of the first folding plate.

10. The display device of claim 5, wherein
when the first and second folding plates are folded, the first and second support plates face each other, and
when the first and second folding plates are folded, the second support plate is disposed between the first support plate and the third support plate.

11. The display device of claim 10, wherein the stiffness of the first reverse curvature portion is greater than the stiffness of the second reverse curvature portion.

12. The display device of claim 10, wherein a depth of each of the second grooves in a direction perpendicular with respect to a rear surface of the first folding plate is greater than a depth of each of the first grooves in the direction perpendicular with respect to the rear surface of the first folding plate.

13. The display device of claim 2, wherein a width of each of the first grooves in a direction perpendicularly crossing an extending direction of each of the first and second grooves is different from a width of each of the second grooves in the direction perpendicularly crossing the extending direction of each of the first and second grooves.

14. The display device of claim 2, wherein a number of the first grooves per unit length is different from a number of the second grooves per unit length.

15. The display device of claim 2, wherein a length of each of the first grooves in an extending direction of the first and second grooves is different from a length of each of the second grooves in the extending direction of the first and second grooves.

16. A display device comprising:
a display module; and
a support plate disposed below the display module and including a first support plate, a second support plate, and a first folding plate disposed between the first support plate and the second support plate,
wherein the first folding plate includes:
a curved portion in which a plurality of first openings is defined;
a first reverse curvature portion disposed between the first support plate and the curved portion; and
a second reverse curvature portion disposed between the second support plate and the curved portion,
wherein the curved portion is convexly bent outward, and each of the first reverse curvature portion and the second reverse curvature portion is concavely bent inward when the first fold plate is folded,
wherein a plurality of first grooves is defined on a rear surface of the first reverse curvature portion, and a plurality of second grooves is defined on a rear surface of the second reverse curvature portion, and
wherein each of the first grooves has a different size from each of the second grooves.

17. The display device of claim 16, wherein
a depth of each of the first grooves in a direction perpendicular with respect to a rear surface of the first folding plate is different from a depth of each of the second grooves in the direction perpendicular with respect to the rear surface of the first folding plate, and
a width of each of the first grooves in a direction perpendicularly crossing an extending direction of each of the first and second grooves is different from a width of each of the second grooves in the direction perpendicularly crossing the extending direction of each of the first and second grooves.

18. The display device of claim 16, wherein
a number of the first grooves per unit length is different from a number of the second grooves per unit length, and
a length of each of the first grooves in an extending direction of the first and second grooves is different from a length of each of the second grooves in the extending direction of the first and second grooves.

19. The display device of claim 16, wherein the support plate further comprises:
a third support plate; and
a second folding plate disposed between the second support plate and the third support plate, wherein a plurality of second openings is defined in the second folding plate, and
the first folding plate is foldable in a dumbbell shape,
the first and second reverse curvature portions are bent opposite to the curved portion when the first folding plate is folded in the dumbbell shape, and
the second folding plate is foldable in a U-like shape.

20. A display device comprising:
a display module; and
a support plate disposed below the display module,
wherein the support plate includes:
a first support plate;
a second support plate; and
a first folding plate disposed between the first support plate and the second support plate, wherein the first folding plate is foldable in a dumbbell shape,
wherein the first folding plate including:
a curved portion bent to have a predetermined curvature when the first folding plate is folded in the dumbbell shape;
a first reverse curvature portion disposed between the first support plate and the curved portion, wherein the first reverse curvature portion is bent opposite to the curved portion when the first folding plate is folded in the dumbbell shape; and
a second reverse curvature portion disposed between the second support plate and the curved portion, wherein the second reverse curvature portion is bent opposite to the curved portion when the first folding plate is folded in the dumbbell shape,
wherein the curved portion is convexly bent outward, and each of the first reverse curvature portion and the second reverse curvature portion is concavely bent inward when the first fold plate is folded, and
wherein a stiffness of the first reverse curvature portion is different from a stiffness of the second reverse curvature portion.

* * * * *